US010602625B2

(12) United States Patent
Kang et al.

(10) Patent No.: US 10,602,625 B2
(45) Date of Patent: Mar. 24, 2020

(54) DISPLAY DEVICE

(71) Applicant: LG ELECTRONICS INC., Seoul (KR)

(72) Inventors: Seunggyu Kang, Seoul (KR); Woohyuk Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/027,682

(22) Filed: Jul. 5, 2018

(65) Prior Publication Data

US 2019/0029129 A1   Jan. 24, 2019

(30) Foreign Application Priority Data

Jul. 20, 2017   (KR) .................. 10-2017-0092279

(51) Int. Cl.
*H05K 5/00* (2006.01)
*G06F 1/16* (2006.01)
(Continued)

(52) U.S. Cl.
CPC ......... *H05K 5/0017* (2013.01); *G02F 1/1333* (2013.01); *G02F 1/133308* (2013.01); *G06F 1/1601* (2013.01); *H01L 51/5246* (2013.01); *H05K 1/14* (2013.01); *H05K 1/142* (2013.01); *H05K 5/0008* (2013.01); *H05K 5/0247* (2013.01); *G02F 1/13452* (2013.01); *G02F 2001/133314* (2013.01);
(Continued)

(58) Field of Classification Search
CPC .. H05K 5/00; H05K 5/02; H05K 7/14; H05K 7/1427; H05K 7/20954; H05K 5/0017; G06F 1/16; G06F 1/1601; G06F 1/18; G06F 1/189; G06F 1/123
USPC ................. 361/749–750, 760–784, 803; 174/250–262; 349/149–158
See application file for complete search history.

(56) References Cited

U.S. PATENT DOCUMENTS

2012/0106122 A1   5/2012   Ryu et al.
2013/0100357 A1*  4/2013   Yokawa ............... G02B 6/0055
                                                                                348/725
(Continued)

FOREIGN PATENT DOCUMENTS

KR   10-2012-0044843   5/2012
KR   10-2016-0141262   12/2016
(Continued)

OTHER PUBLICATIONS

International Search Report dated Nov. 2, 2018 issued in Application No. PCT/KR2018/007792.

*Primary Examiner* — Tuan T Dinh
(74) *Attorney, Agent, or Firm* — KED & Associates LLP

(57) ABSTRACT

A display device is disclosed. The display device of the present invention may comprise: a display panel including: a front surface; a first edge positioned at an end of the front surface; and a second edge positioned at another end of the front surface; and a rear plate positioned at a rear of the display panel, the rear plate including: a flat plate portion facing the display panel; a first wing bent and extended toward a front of the display panel from the flat plate portion, the first wing covering the first edge; and a second wing bent and extended toward the front of the display panel from the flat plate portion, the second wing covering the second edge.

11 Claims, 29 Drawing Sheets

(51) Int. Cl.
*H05K 1/14* (2006.01)
*G02F 1/1333* (2006.01)
*H01L 51/52* (2006.01)
*H05K 5/02* (2006.01)
*G02F 1/1345* (2006.01)

(52) U.S. Cl.
CPC ............... *G02F 2201/503* (2013.01); *G06F 2200/1612* (2013.01); *H01L 51/529* (2013.01); *H01L 51/5237* (2013.01); *H05K 2201/10128* (2013.01); *H05K 2201/10356* (2013.01); *H05K 2201/10409* (2013.01)

(56) References Cited

U.S. PATENT DOCUMENTS

| | | | |
|---|---|---|---|
| 2014/0198436 A1* | 7/2014 | Lim | H04M 1/0266 361/679.01 |
| 2015/0177029 A1* | 6/2015 | Landis | G01N 33/0009 137/377 |
| 2016/0085330 A1* | 3/2016 | Namkung | G06F 1/1626 29/592.1 |
| 2016/0135305 A1* | 5/2016 | Shin | G02F 1/133308 361/694 |
| 2016/0192523 A1* | 6/2016 | Lin | G02F 1/133308 361/679.01 |
| 2016/0300513 A1* | 10/2016 | Ren | G09F 9/301 |
| 2016/0360625 A1* | 12/2016 | Ogasawara | H05B 33/0803 |
| 2017/0064851 A1 | 3/2017 | Shin et al. | |
| 2017/0118859 A1* | 4/2017 | Kang | H05K 5/0017 |

FOREIGN PATENT DOCUMENTS

| | | |
|---|---|---|
| KR | 10-2017-0026043 | 3/2017 |
| KR | 10-2017-0048634 | 5/2017 |
| KR | 10-2017-0050512 | 5/2017 |

* cited by examiner

FIG. 22
(a)
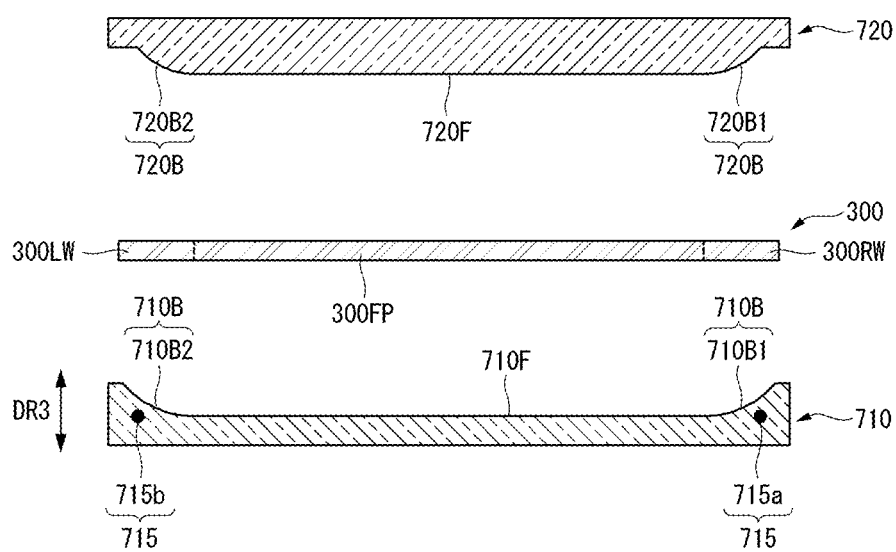
(b)
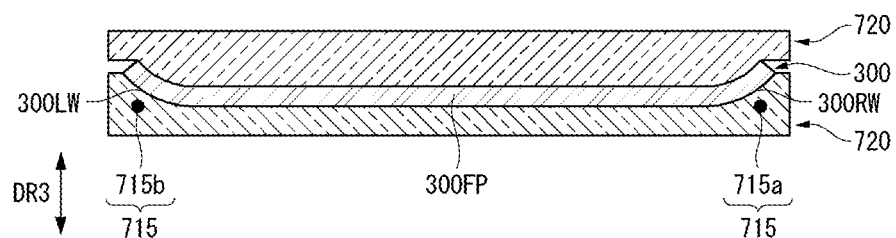
(c)
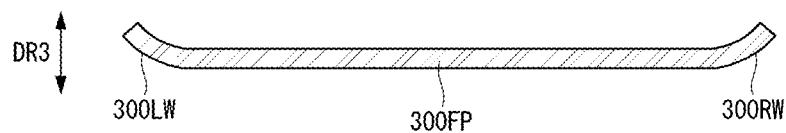

DISPLAY DEVICE

This application claims the benefit of Korean Patent Application No. 10-2017-0092279 filed on Jul. 20, 2017, the entire contents of which are incorporated herein by reference for all purposes as if fully set forth herein.

BACKGROUND OF THE INVENTION

Field of the Invention

The present invention relates to a display device.

Discussion of the Related Art

As the information society develops, the demand for display devices is increasing in various forms. In recent years, display devices using various display panels such as a liquid crystal display panel (LCD panel), a plasma display panel (PDP), an electro luminescent display panel (ELD panel), and a vacuum fluorescent display panel (VFD panel) have been studied and used.

The edge of the display panel may be vulnerable to external impact. As the bezel of a display device becomes slimmer, researches on a display device having a sturdy edge have been conducted.

SUMMARY OF THE INVENTION

Accordingly, an object of the present disclosure is to address the above-described and other problems.

Another object of the present invention is to provide a display device including a slim bezel.

Another object of the present invention is to provide the display device including a slim bezel with rigidity.

Another object of the present invention is to provide a display device including a transparent rear and lateral cover.

Another object of the present invention is to provide a display panel with a protection on edges of the display panel.

According to an aspect of the present invention, there is provided a display device comprising: a display panel including: a front surface; a first edge positioned at an end of the front surface; and a second edge positioned at another end of the front surface; and a rear plate positioned at a rear of the display panel, the rear plate including: a flat plate portion facing the display panel; a first wing bent and extended toward a front of the display panel from the flat plate portion, the first wing covering the first edge; and a second wing bent and extended toward the front of the display panel from the flat plate portion, the second wing covering the second edge.

According to another aspect of the present invention, the display device may further comprise a middle plate placed between the display panel and the rear plate, the middle plate may be attached to the display panel.

According to another aspect of the present invention, the display device may further comprise a coupling protrusion projecting toward a rear of the middle plate from a rear surface of the middle plate, the rear plate may include a fastening hole corresponding to the coupling protrusion, and the coupling protrusion may be fitted into the fastening hole of the rear plate.

According to another aspect of the present invention, the coupling protrusion may include a hollow portion opened toward the rear of the middle plate, the display device may further comprise: a PCB plate positioned behind of the rear plate, the PCB plate including a fastening hole into which the coupling protrusion is fitted; and a screw configured to be fitted in the hollow portion formed in the coupling protrusion.

According to another aspect of the present invention, an air gap may be formed between the middle plate and the rear plate.

According to another aspect of the present invention, the middle plate may include a metal.

According to another aspect of the present invention, the first edge may be located opposite to the second edge, the first wing may be placed at a left side of the flat plate portion, and the second wing may be placed at a right side of the flat plate portion.

According to another aspect of the present invention, the display panel may further include a third edge connecting the first edge with the second edge, the rear plate may further include a third wing, the third wing may be bent and extended toward the front of the display panel from the flat plate portion, and the third wing may cover the third edge.

According to another aspect of the present invention, the rear plate includes: a first corner adjacent to a location where an end of the first edge meets an end of the third edge; and a second corner adjacent to a location where an end of the second end meets another end of the third edge, an end of the first wing may be adjacent to an end of the third wing and spaced apart from the end of the third wing at the first corner, an end of the second wing may be adjacent to another end of the third wing and spaced apart from the other end of the third wing at the second corner.

According to another aspect of the present invention, the display panel may further include a fourth edge connecting the first and second edges and facing the third edge, the rear plate may further include a fourth wing, the fourth wing may be bent and extended toward the front of the display panel from the flat plate portion, and the fourth wing may cover the fourth edge.

According to another aspect of the present invention, The rear plate may includes: a third corner adjacent to a location where another end of the second edge meets an end of the fourth edge; and a fourth corner adjacent to a location where another end of the first edge meets another end of the fourth edge, another end of the second wing may be adjacent to an end of the fourth wing and spaced apart from the end of the fourth wing at the third corner, another end of the first wing may be adjacent to another end of the fourth wing and spaced apart from the other end of the fourth wing at the fourth corner.

According to another aspect of the present invention, the display device may further comprise: a member layer connected to the display panel, wherein at least a portion of the member layer is placed between the display panel and the rear plate; a source PCB connected to the member layer, the source PCB placed between the display panel and the rear plate; and a cable connected to the source PCB.

According to another aspect of the present invention, the flat plate portion may include a slot, and the cable may pass through the slot.

According to another aspect of the present invention, The display device may further comprise: a PCB plate positioned at a rear of the rear plate, the PCB plate coupled with the rear plate, the PCB plate including a cable hole corresponding to the slot; and a T-con board mounted on a rear surface of the PCB plate, the cable may pass through the slot of the rear plate and the cable hole of the PCB plate, and the cable may be configured to be connected to the T-con board.

According to at least one of embodiments of the present invention, a display device with a slim bezel can be provided.

According to at least one of embodiments of the present invention, there can be provided rigidity to the display device with a slim bezel.

According to at least one of embodiments of the present invention, there can be provided a display device including a transparent rear and lateral cover.

According to at least one of embodiments of the present invention, edges of the display panel can be protected.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 22 is view showing an process for manufacturing a rear plate including a wing.

DETAILED DESCRIPTION OF THE EMBODIMENTS

Figure 1:
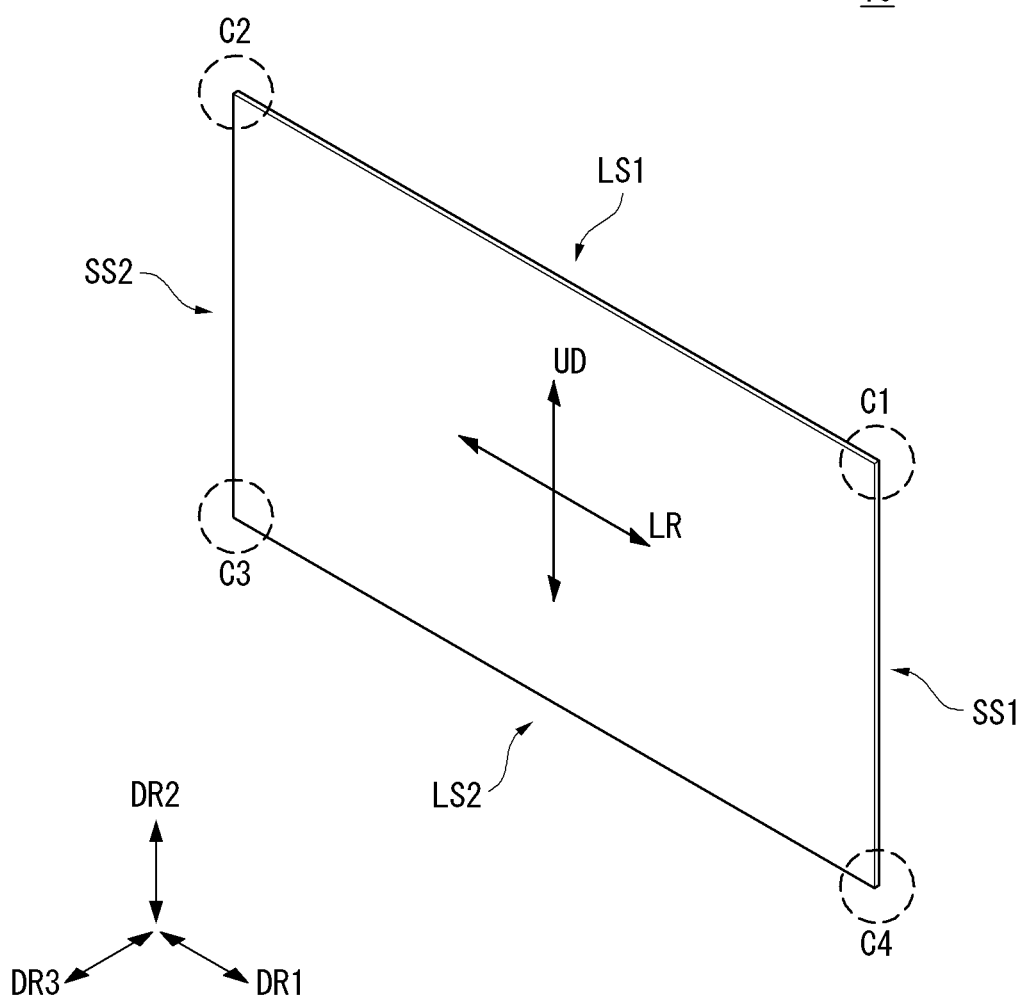
FIGS. 1 and 2 are views of display device according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, an organic light emitting diode panel (OLED panel) will be described as an example of the display panel. However, the display panel applicable to the present invention is not limited to the organic display panel.

Referring to FIG. 1, the display device 10 may include a first long side LS1 and a second long side LS2 opposite to the first long side LS1. The display device 10 may include a first short side SS1 and a second short side SS2. The first short side SS1 may connect the first long side LS1 with the second long side LS2. The second short side SS2 may connect the first long side LS1 with the second long side LS2. The second short side SS2 may be positioned opposite to the first short side SS1.

The region adjacent to the first short side SS1 may be referred to as a first side area. The region adjacent to the second short side SS2 may be referred to as a second side area. The region adjacent to the first long side LS1 may be referred to as a third side area. The region adjacent to the second long side LS2 may be referred to as a fourth side area.

For the convenience for explanation, the length of the long sides LS1 and LS2 may be longer than the length of the short sides SS1 and SS2. It is possible that the length of the long sides LS1 and LS2 may be substantially same as the length of the short sides SS1 and SS2.

The first direction DR1 may be a direction along the long sides LS1 and LS2 of the display device 10. The second direction DR2 may be a direction along the short sides SS1 and SS2 of the display device 10.

The first direction DR1 may be parallel to a horizontal axis. The first direction DR1 may be a first horizontal axis. The second direction DR2 may be parallel to a vertical axis. The second direction DR2 may be a vertical axis. The third direction DR3 may be parallel to a horizontal axis. The third direction DR3 may be a second horizontal axis.

A side on which the display device 10 displays the image may be referred to as a 'forward' or a 'front side' of the display device 10. A side on which the image can not be viewed may be referred to as a 'rearward' or a 'rear side' of the display device 10.

From the viewpoint of the front side of the display device 10, the first long side LS1 may be referred to as an upper side or an upper surface, the second long side LS2 side may be referred to as a lower side or a lower surface, the first short side SS1 may be referred to as a right side or the right side, and the second short side SS2 may be referred to as a left side or a left side.

A lateral side of the display device 10 may stand for at least one among the upper side, the lower side, the right side, and the left side.

The first long side LS1, the second long side LS2, the first short side SS1 and the second short side SS2 may be referred to as an edge of the display unit 20. The area where the first long side LS1, the second long side LS2, the first short side SS1, and the second short side SS2 meet with each other may be referred to as a corner. For example, the region adjacent to a point where the first long side LS1 and the first short side SS1 meet may be referred to as a first corner C1. The region adjacent to a point where the first long side LS1 and the second short side SS2 meet may be referred to as a second corner C2. The region adjacent to a point where the second short side SS2 and the second long side LS2 meet may be referred to as a third corner C3. The region adjacent to a point where the second long side LS2 and the first short side SS1 meet may be referred to as a fourth corner C4.

The direction from the first short side SS1 to the second short side SS2 or the direction from the second short side SS2 to the first short side SS1 may be referred to as the left and right direction LR. The direction from the first long side LS1 to the second long side LS2 or the direction from the second long side LS2 to the first long side LS1 may be referred to as the up and down direction UD.

Figure 2:
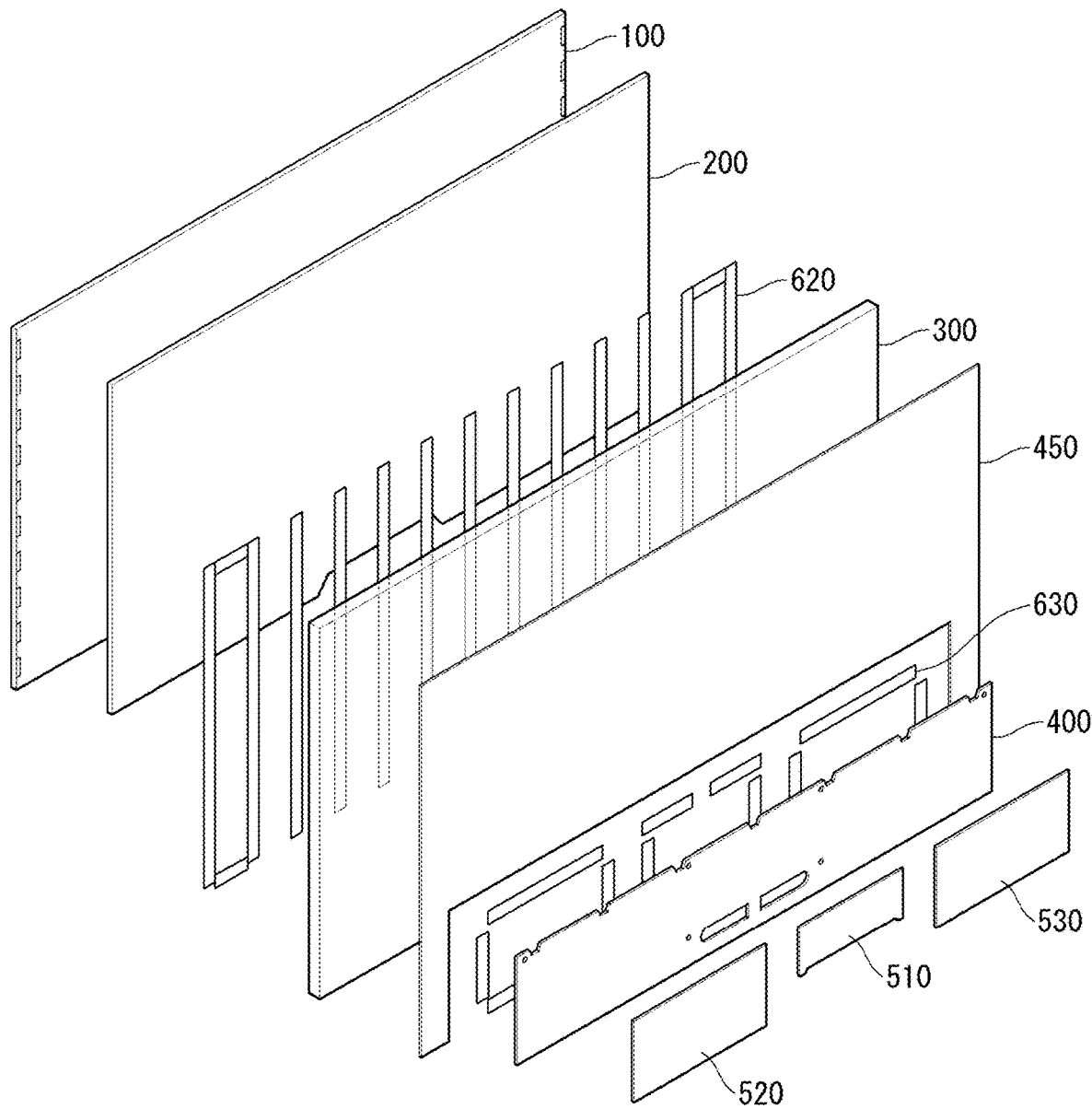

Referring to FIG. 2, the display panel 100 is provided on the front surface of the display device 10 and images can be displayed. The display panel 100 divides an image into a plurality of pixels, and outputs an image by adjusting color, brightness, and saturation of each pixel. The display panel 100 may be divided into an active area in which an image is displayed and an inactive area in which no image is displayed.

The display panel 100 may include an organic display panel (OLED panel). The display panel 100 can emit light by itself. The display panel 100 may have a very thin thickness.

The middle plate 200 may be positioned behind the display panel 100. The middle plate 200 may be attached to the rear surface of the display panel 100. The middle plate 200 may be smaller than the display panel 100. The middle plate 200 may be coupled to the rear surface of the display panel 100 by a double-sided adhesive tape or/and a magnet. The middle plate 200 may include a ferromagnetic material or a paramagnetic material.

The middle plate 200 may provide rigidity to the display panel 100. The middle plate 200 can receive heat from the display panel 100 and discharge it. The middle plate 200 may have high heat conductivity. The middle plate 200 may include a metal. For example, the middle plate 200 may include aluminum or an aluminum alloy.

The rear plate 300 may be positioned behind the middle plate 200. The rear plate 300 can form an inner space. The rear plate 300 can accommodate the middle plate 200 and the display panel 100. The middle plate 200 and the display panel 100 may be located in the inner space formed in the rear plate 300. The inner space of the rear plate 300 may be opened toward the front of the rear plate 300. The inner space of the rear plate 300 may be opened toward a part of the lateral side of the rear plate 300. The rear plate 300 can cover at least a part of the lateral side of the middle plate 200 and the display panel 100.

The rear plate 300 may include a transparent material. The rear plate 300 may include a semi-transparent material. The rear plate 300 may include a transparent material and a translucent material. The rear plate 300 may be made of a transparent material containing an opaque/translucent material. For example, the rear plate 300 can form both a transparent region and a translucent region.

For example, the rear plate 300 may include silicon dioxide ($SiO2$). For example, the rear plate 300 may include polycarbonate. For example, the rear plate 300 may include polymethylmethacrylate (PMMA). For example, the rear plate 300 may include methyl methacrylate-styrene (MS).

Light can pass through the rear plate 300. The rear plate 300 may have a refractive index. The rear plate 300 can pass, refract, or reflect at least a part of incident light. The rear plate 300 may have a color.

For example, the rear plate 300 may contain at least one of glass, plastic, crystal, and quartz. The surface of the rear plate 300 may be rough. The rear plate 300 is capable of diffusely reflecting light.

The rear plate 300 may include fibers to reinforce rigidity. For example, the rear plate 300 may include at least one of a glass fiber, a carbon fiber, a metallic wire, and a metallic fiber. The rear plate 300 may include micro fibers.

The second adhesive member 620 may be positioned between the middle plate 200 and the rear plate 300. The second adhesive member 620 can couple the middle plate 200 with the rear plate 300. The second adhesive member 620 may include a double-sided adhesive tape. The second adhesive member 620 may be transparent. For example, the second adhesive member 620 may comprise a transparent material. The PCB plate 400 may be located behind the rear plate 300. The PCB plate 400 may be in contact with the rear surface of the rear plate 300. The PCB plate 400 may be coupled to the rear plate 300. The rear surface of the PCB plate 400 can accommodate the electronic components. For example, the rear surface of the PCB plate 400 may seat the T-con board 510, the power supply 520, and the main board 530.

The material of the PCB plate 400 may be different from that of the rear plate 300. For example, the PCB plate 400 may comprise a metal. For example, the PCB plate 400 may be formed through a pressing process.

The third adhesive member 630 may be positioned between the rear plate 300 and the PCB plate 400. The third adhesive member 630 can couple the PCB plate 400 with the rear plate 300. The third adhesive member 630 may include a double-sided adhesive tape.

The first back cover 450 may be positioned behind the rear plate 300. The first back cover 450 may not overlap the PCB plate 400. The first back cover 450 may cover at least a part of the rear surface of the rear plate 300. The first back cover 450 may be coupled to the rear plate 300.

The first back cover 450 can provide rigidity to the rear plate 300. The first back cover 450 may be flexible. For example, the first back cover 450 may include a reinforcing film. The first back cover 450 may be opaque. The first back cover 450 may be applied to the display device 10 described later.

A second back cover (not shown) may be positioned on the rear surface of the T-con board 510, the power supply 520, and the main board 530. The second back cover (not shown) can protect the T-con board 510, the power supply 520, and the main board 530.

Figure 3:
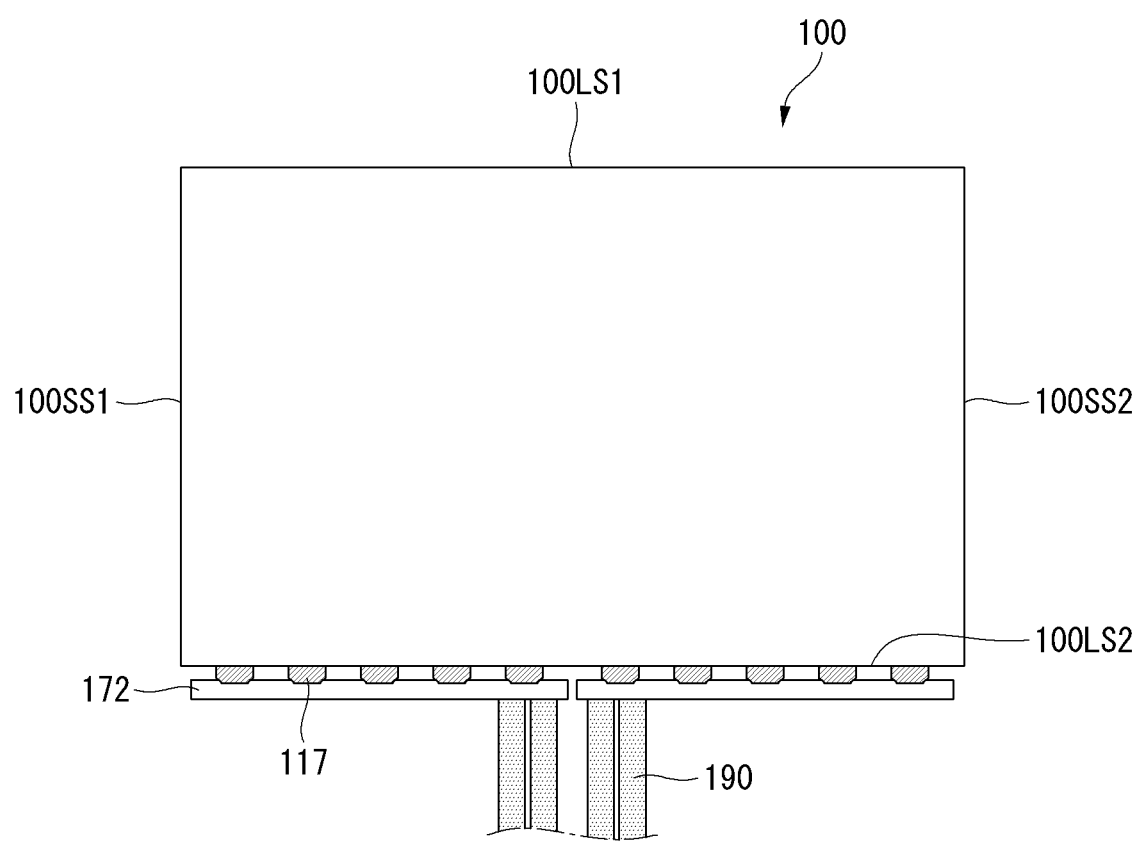
FIGS. 3 to 14 are views of assembling process of display device according to an embodiment of the present invention.

Referring to FIG. 3, the rear surface of the display panel 100 can be observed. The display panel 100 may form a first long side 100LS1, a second long side 100LS2, a first short side 100SS1 and a second short side 100SS2 of the display panel 100. The first long side 100LS1, the second long side 100LS2, the first short side 100SS1 and the second short side 100SS2 of the display panel 100 can form the rim or the perimeter of the display panel 100. The first long side 100LS1, the second long side 100LS2, the first short side 100SS1 and the second short side 100SS2 of the display panel 100 may correspond to the first long side LS1, the second long side LS2, the first short side SS1, and the second short side SS2 of the display device 10 (see FIG. 1), respectively. The first short side 100SS1 of the display panel 100 may be referred to as a first panel side 100SS1 or a first panel edge 100SS1 or a first edge 100SS1. The second short side 100SS2 of the display panel 100 may be referred to as a second panel side 100SS2 or a second panel edge 100SS2 or a second edge 100SS2. The first long side 100LS1 of the display panel 100 may be referred to as the third panel side 100LS1 or the third panel edge 100LS1 or the third edge 100LS1. The second long side 100LS2 of the display panel 100 may be referred to as the fourth panel side 100LS2 or the fourth panel edge 100LS2 or the fourth edge 100LS2.

A member layer 117 may extend from an edge of the display panel 100. For example, the member layer 117 may have a shape extending from the second long side LS2 of the display panel 100. A plurality of member layers 117 may be provided. The member layer 117 may be electrically connected to the display panel 100. The member layer 117 may include at least one of a chip on film (COF), a chip on glass (COG), a flexible printed circuit board (FPCB), and a tape carrier package (TCP).

The source PCB 172 may have a shape extending from the member layer 117. The source PCB 172 may be electrically connected to the member layer 117. The source PCB 172 may be provided in plurality.

The cable 190 may have a shape extending from the source PCB 172. The cable 190 may be electrically connected to the source PCB 172. The cable 190 may be provided in plurality.

The power and/or signal provided to the cable 190 may be transferred to the source PCB 172. The power and/or signal provided to the source PCB 172 may be distributed to the member layers 117. The power and/or signal distributed to the member layer 117 may be supplied to the display panel 110.

Figure 4:
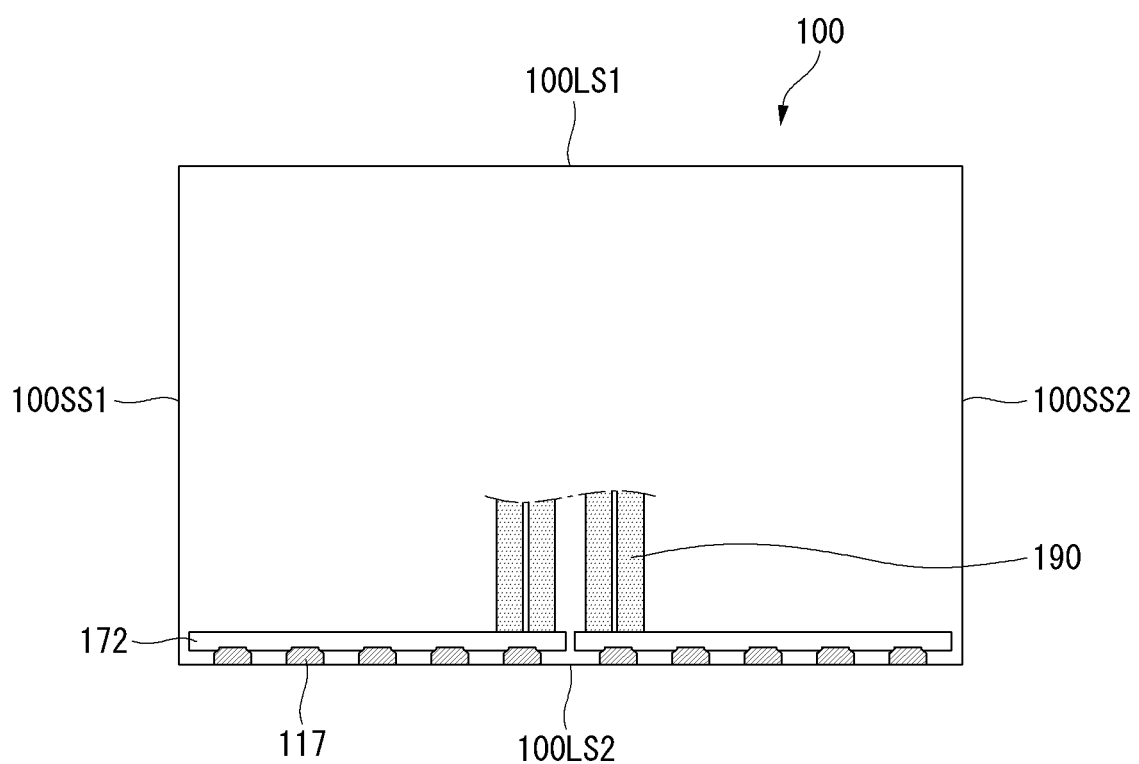

Referring to FIG. 4, the rear surface of the display panel 100 can be observed. The member layer 117 may be flexible. The member layer 117 can be bent toward the rear surface of the display panel 100. The member layer 117 may be located behind the display panel 100. The source PCB 172 connected to the member layer 117 may be located behind the display panel 100. The cable 190 connected to the source PCB 172 may be located behind the display panel 100.

The member layer 117, the source PCB 172, and the cable 190 may be adjacent the edge of the display panel 100. The edge of the display panel 100 may meet with the member layer 117. For example, the member layer 117, the source PCB 172, and the cable 190 may be adjacent to the second long side 100LS2 of the display panel 100.

Figure 5:
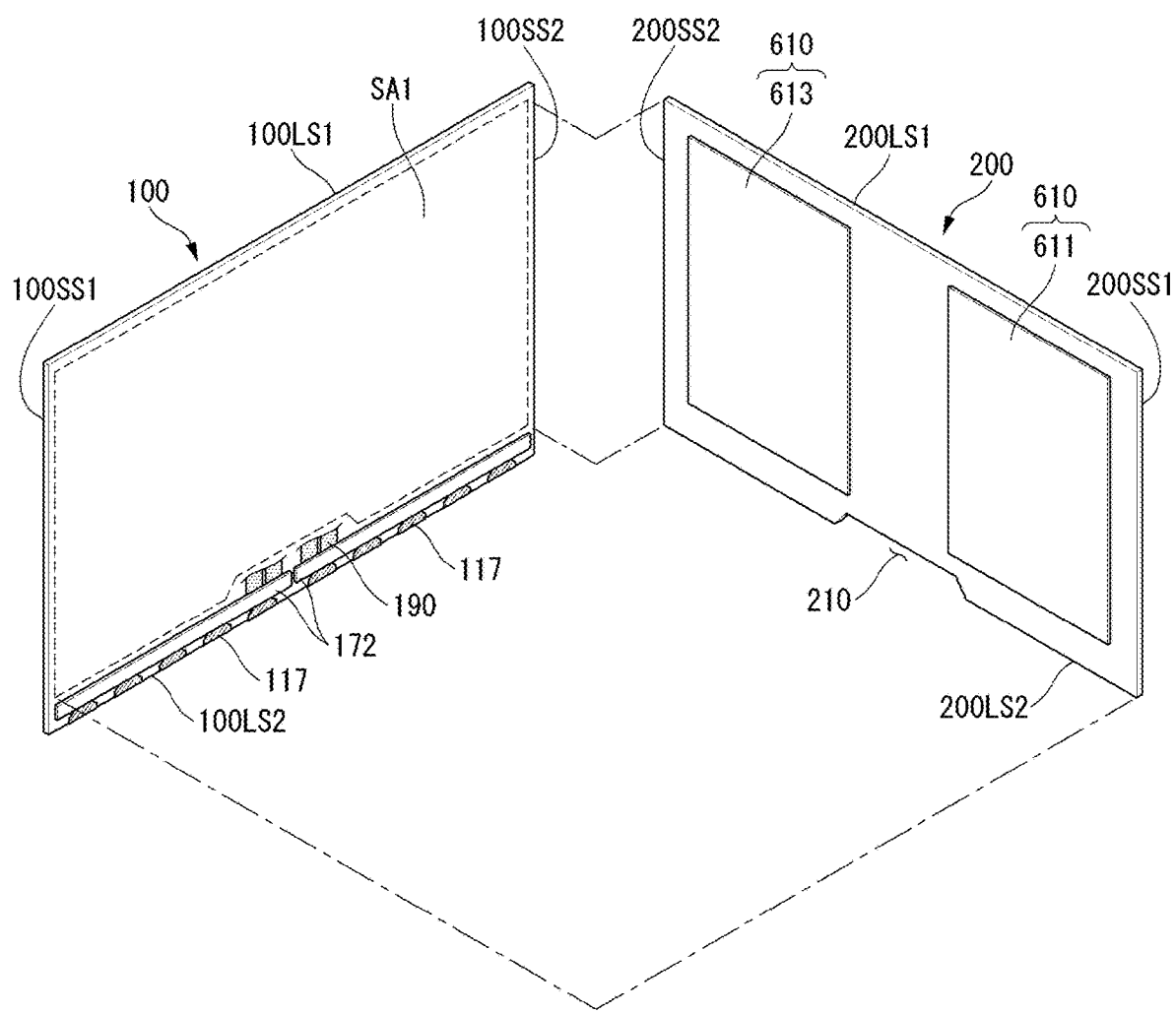

Referring to FIG. 5, the rear surface of the display panel 100 and the front surface of the middle plate 200 can be observed. The display panel 100 may be coupled to the middle plate 200. The rear surface of the display panel 100 can be coupled with the front surface of the middle plate 200.

The middle plate 200 may form a first long side 200LS1, a second long side 200LS2, a first short side 200SS1 and a second short side 200SS2 of the middle plate. The first long side 200LS1, the second long side 200LS2, the first short side 200SS1 and the second short side 200SS2 of the middle plate 200 can form the rim or the perimeter of the middle plate 200. The first long side 200LS1, the second long side 200LS2, the first short side 200SS1 and the second short side 200SS2 of the middle plate 200, may be corresponded to the first long side 100LS1, the second long side 100LS2, the first short side 100SS1 and the second short side 100SS2 of the display panel 100 respectively. The first short side 200SS1 of the middle plate 200 may be referred to as a first middle plate side 200SS1 or a first middle plate edge 200SS1. The second short side 200SS2 of the middle plate 200 may be referred to as a second middle plate side 200SS2 or a second middle plate edge 200SS2. The first long side 200LS1 of the middle plate 200 may be referred to as the third middle plate side 200LS1 or the third middle plate edge 200LS1. The second long side 200LS2 of the middle plate 200 may be referred to as the fourth middle plate side 200LS2 or the fourth middle plate edge 200LS2.

The middle plate 200 may form a cable receiving groove 210. The cable receiving groove 210 may have a curved shape from an edge of the middle plate 200 toward the center of the middle plate 200. For example, the cable receiving groove 210 may be curved toward the center of the middle plate 200 from the second long side 200LS2 of the middle plate 200.

The size of the middle plate 200 may be smaller than the size of the display panel 100. The middle plate 200 may be seated in the first seating region SA1 formed on the display panel 100. The first seating region SA1 may be located in the entire area of the display panel 100. The first seating region SA1 may be represented by an imaginary line (indicated by a dotted line in FIG. 5).

The first adhesive member 610 may be positioned between the display panel 100 and the middle plate 200. The first adhesive member 610 can couple the display panel 100 with the middle plate 200. The first adhesive member 610 may include a double-sided adhesive tape. The first adhesive member 610 may be provided in plural. For example, the first adhesive member 610 may include a first right-side adhesive member 611 and a first left-side adhesive member 613.

Figure 6:
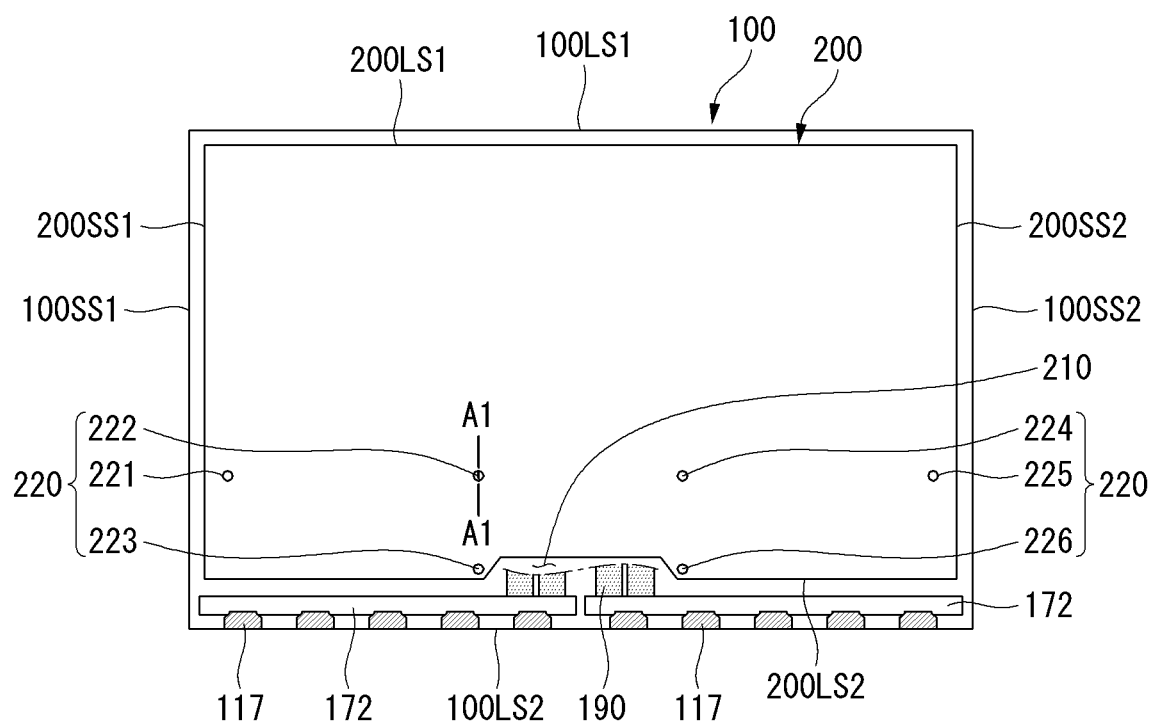

Referring to FIG. 6, a state in which the display panel 100 and the middle plate 200 are coupled can be observed. In FIG. 6, the rear surface of the middle plate 200 can be observed. The middle plate 200, the member layer 117, the source PCB 172, and the cable 190 may be located behind the display panel 100. The middle plate 200, the member layer 117, and the source PCB 172 may form the same layer or may be positioned in a single layer.

The member layer 117, the source PCB 172 and the cable 190 may be located between the middle plate 200 and an edge of the display panel 100. For example, the member layer 117, the source PCB 172, and the cable 190 may be disposed between the middle plate 200 and the second long side 100LS2 of the display panel 100.

The cable receiving groove 210 of the middle plate 200 may have a concave shape with respect to an edge of the display panel 100. For example, the cable receiving groove 210 can be concave with respect to the second long side LS2 of the display panel 100. The cable receiving recess 210 may accommodate at least a portion of the cable 190.

The coupling protrusions 220 may be formed on the rear surface of the middle plate 200. The coupling protrusions 220 may extend from the rear surface of the middle plate 200. The coupling protrusions 220 may protrude toward the rear of the middle plate 200.

The coupling protrusion 220 may be formed adjacent to an edge of the middle plate 200. For example, the coupling protrusion 220 may be formed adjacent to the second long side 200LS2 of the middle plate 200. The coupling protrusion 220 may be formed adjacent to the cable receiving groove 210. The coupling protrusions 220 may be provided in plurality. For example, the coupling protrusions 220 may include first to sixth coupling protrusions 221 to 226.

Figure 7:
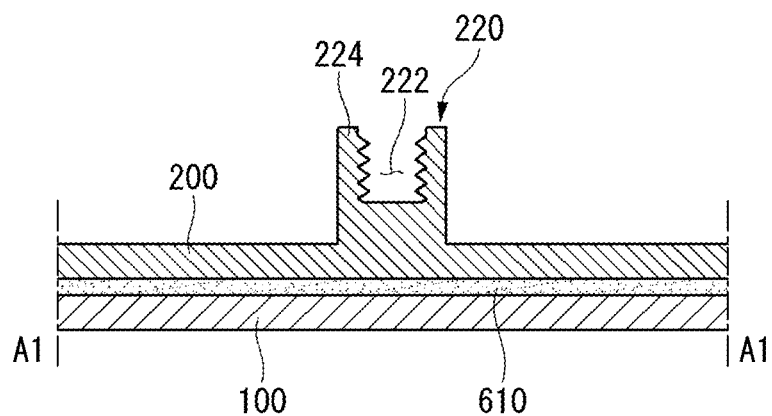

FIG. 7 is a cross-sectional view of the display device taken along line A1-A1 of FIG. 6.

Referring to FIG. 7, the display panel 100 may form a front surface of the display device 10. The first adhesive member 610 may be in contact with the rear surface of the display panel 100. The middle plate 200 may be positioned behind the display panel 100. The middle plate 200 can be coupled to the display panel 100 by the first adhesive member 610.

The coupling protrusions 220 may be formed on the rear surface of the middle plate 200. The coupling protrusions 220 may protrude toward the rear of the middle plate 200. The coupling protrusions 200 may include pem nut or swage nut or self-clinching nut.

The coupling protrusion 200 may include a pillar 220. The coupling protrusions 200 may form the hollow portion 222. The hollow portion 222 may be formed in the pillar 220 of the coupling protrusion 200. The hollow portion 222 of the coupling portion 200 can be opened toward the rear side of the middle plate 200. A female screw thread may be formed on the hollow portion 222 of the coupling portion 200.

Figure 8A:
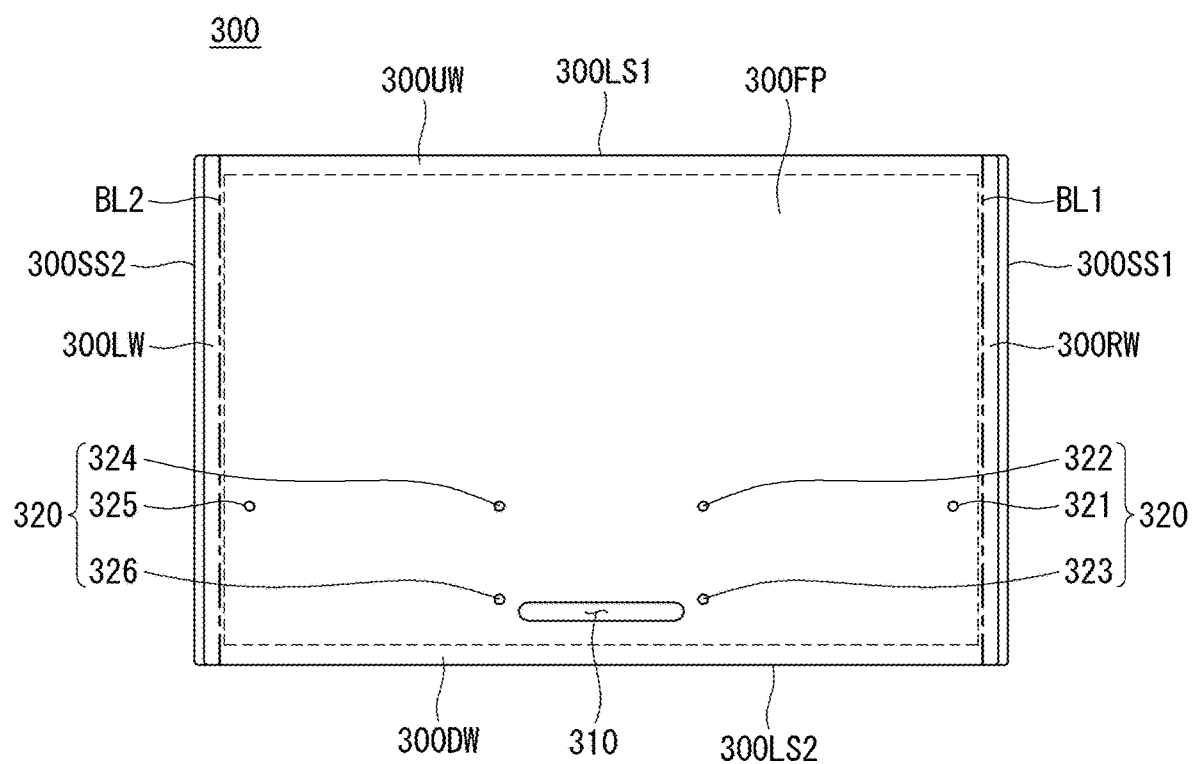

Referring to FIG. 8A, a front side of the rear plate 300 can be observed. The rear plate 300 may form a first long side 300LS1, a second long side 300LS2, a first short side 300SS1 and a second short side 300SS2 of the rear plate. The first long side 300LS1, the second long side 300LS2, the first short side 300SS1 and the second short side 300SS2 of the rear plate 200 can form the rim or the perimeter of the rear plate 200. The first long side 300LS1, the second long side 300LS2, the first short side 300SS1 and the second short side 300SS2 of the rear plate 200, may be corresponded to the first long side 100LS1, the second long side 100LS2, the first short side 100SS1 and the second short side 100SS2 of the display panel 100 (see FIG. 6) respectively. The first short side 300SS1 of the rear plate 300 may be referred to as a first cover side 300SS1 or a first cover edge 300SS1. The second short side 300SS2 of the rear plate 300 may be referred to as a second cover side 300SS2 or a second cover edge 300SS2. The first long side 300LS1 of the rear plate 300 may be referred to as the third cover side 300LS1 or the third cover edge 300LS1. The second long side 300LS2 of the rear plate 200 may be referred to as the fourth cover side 300LS2 or the fourth cover edge 300LS2.

The rear plate 300 may form a slot 310. The slot 310 may be formed adjacent to an edge of the rear plate 300. For example, the slot 310 may be located adjacent to the second long side 300LS2 of the rear plate 300.

The slot 310 may have a longitudinal direction. The slots 310 may be formed to pass through the rear plate 300 in the front-rear direction. The slot 310 may be formed to be elongated alongside of the edge of the rear plate 300 adjacent to the slot 310. For example, the long axis of the slot 310 may be parallel to the second long side 300LS2 of the rear plate 300.

The rear plate 300 can form a fastening hole 320. The fastening holes 320 may pass through the rear plate 300 in the front-rear direction. The plurality of fastening holes 320 may be provided. For example, the fastening hole 320 may include first to sixth fastening holes 321 to 326.

The plurality of fastening holes 321 to 326 may be formed adjacent to an edge of the rear plate 300. For example, the plurality of fastening holes 321 to 326 may be formed adjacent to the second long side 300LS2 of the rear plate 300. The plurality of fastening holes 321 to 326 may be formed adjacent to the slot 310.

The rear plate 300 may include a flat plate portion 300FP. The flat plate portion 300FP of the rear plate 300 may have a flat shape. The flat plate portion 300FP of the rear plate 300 may be surrounded by an outer portion of the rear plate 300.

The rear plate 300 may include a left wing 300LW. The left wing 300LW may be formed extended from the flat plate portion 300FP of the rear plate 300. The left wing 300LW can form the second short side 300SS2 of the rear plate 300.

The rear plate 300 may include a right wing 300RW. The right wing 300RW may be formed extended from the flat plate portion 300FP of the rear plate 300. The right wing 300RW can form the first short side 300SS1 of the rear plate 300.

The rear plate 300 may include a upper wing 300UW. The upper wing 300UW may be formed extended from the flat plate portion 300FP of the rear plate 300. The upper wing 300UW can form the first long side 300LS1 of the rear plate 300. The upper wing 300UW can be a portion of the flat plate portion 300FP. For example, the upper wing 300UW may refer to an upper portion of the flat plate portion 300FP.

The rear plate 300 may include a lower wing 300DW. The lower wing 300DW may be formed extended from the flat plate portion 300FP of the rear plate 300. The lower wing 300DW can form the second long side 300LS2 of the rear plate 300. The lower wing 300DW can be a portion of the flat plate portion 300FP. For example, the lower wing 300DW may refer to a lower portion of the flat plate portion 300FP.

The upper wing 300UW, the right wing 300RW, the lower wing 300DW and the left wing 300LW, can surround the flat plate portion 300FP.

At least one of the upper wing 300 UW, the right wing 300 RW, the lower wing 300 DW and the left wing 300 LW may be bent and extended toward the front of the rear plate 300 from the flat plate portion 300 FP.

For example, the left wing 300LW and the right wing 300RW may be bent and extended from the flat plate portion 300FP toward the front of the rear plate 300.

The left wing 300LW may be located opposite the right wing 300RW. The flat plate portion 300FP can be positioned between the left wing 300LW and the right wing 300RW.

The left wing 300LW and the right wing 300RW may be formed on the left and right sides of the rear plate 300. The left wing 300LW and the right wing 300RW may be disposed on the left and right sides of the flat plate portion 300FP. The left wing 300LW and the right wing 300RW may be symmetrical. The left wing 300LW may be symmetrical with the right wing 300RW with respect to the flat plate portion 300FP.

A bending line may be formed adjacent to the boundary between the right wing 300RW and the flat plate portion 300FP. The bending line formed adjacent to the boundary between the right wing 300RW and the flat plate portion 300FP may be referred to as a first bending line BL1. The first bending line BL1 may be parallel to the first short side 300SS1 of the rear plate 300. The first bending line BL1 may be a virtual line.

A bending line may be formed adjacent to the boundary between the left wing 300LW and the flat plate portion 300FP. The bending line formed adjacent to the boundary between the left wing 300LW and the flat plate portion 300FP may be referred to as a second bending line BL2. The second bending line BL2 may be parallel to the second short side 300SS2 of the rear plate 300. The second bending line BL2 may be a virtual line.

The bent wings 300RW and 300LW may mean at least one of a right wing 300RW and a left wing 300LW which are formed by being bent and extended from the flat plate portion 300FP.

The bent wings 300RW and 300LW may provide steric properties to the rear plate 300. For example, an angle may be formed between the bent wings 300RW and 300LW and the flat plate portion 300FP. For example, a spatial room may be formed between the bent wings 300RW and 300LW and the flat plate portion 300FP.

The bent wings 300RW and 300LW can provide structural stability to the rear plate 300. The bent wings 300RW and 300LW can provide rigidity to the rear plate 300. For example, the bent wings 300RW and 300LW can provide torsional stiffness to the rear plate 300.

The spread wings 300UW and 300DW may refer to at least one of the upper wing 300UW and the lower wing 300DW which are extended from the flat plate portion 300FP. The spread wings 300UW and 300DW can have different widths compared to the bent wings 300RW and 300LW. For example, the width of the spread wings 300UW and 300DW may be smaller than the width of the bent wings 300RW and 300LW.

Figure 8B:
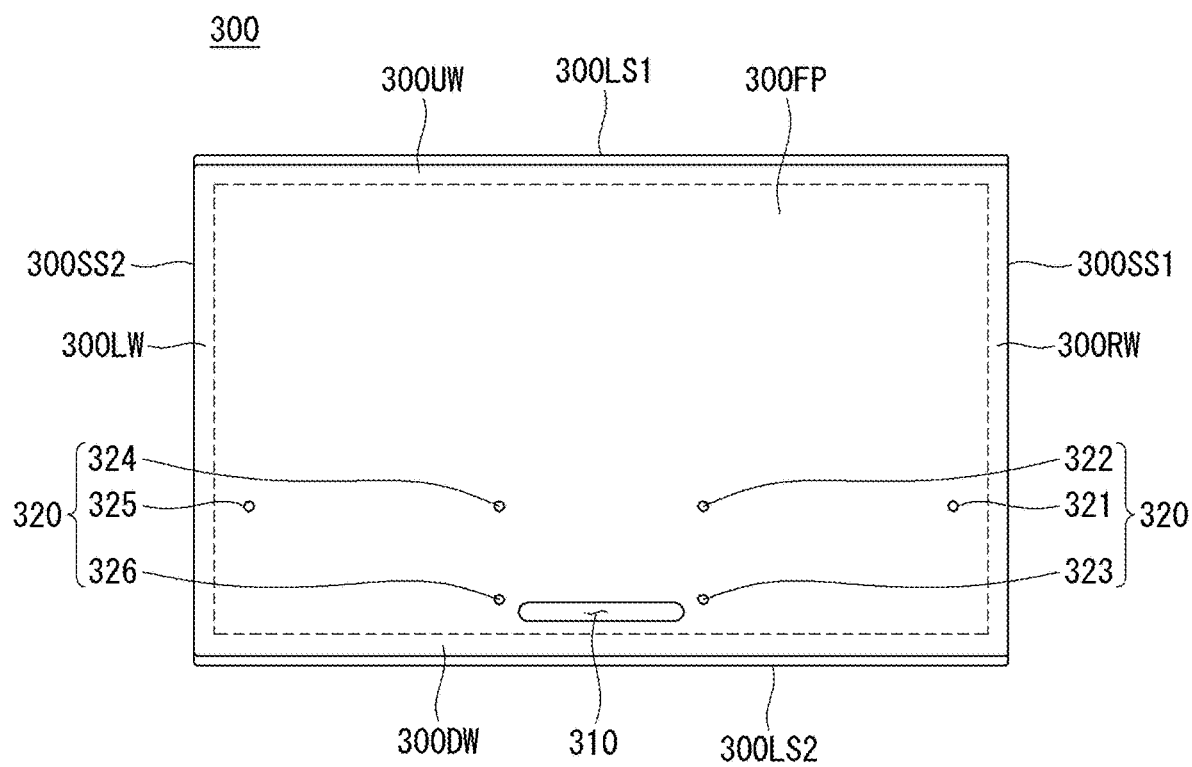

Referring to FIG. 8B, the front surface of the rear plate 300 can be observed. The rear plate 300 may include a flat plate portion 300FP, a right wing 300RW, a left wing 300LW, an upper wing 300UW, and a lower wing 300DW.

The right wing 300RW and the left wing 300LW may be formed being extended from the flat plate 300FP without bending. The lower wing 300DW and the upper wing 300UW may be bent and extended from the flat plate portion 300FP toward the front of the rear plate 300.

The bent wings 300UW and 300DW may mean at least one of the upper wing 300UW and the lower wing 300DW which are bent and extended from the flat plate portion 300FP. The spread wings 300RW and 300LW may mean at least one of the right wing 300RW and the left wing 300LW which are extended from the flat plate 300FP but are not bent.

The lower wing 300DW and the upper wing 300UW can provide rigidity to the rear plate 300. For example, bent wings 300UW and 300LW can provide torsional stiffness to the rear plate 300.

The bent wings 300UW and 300DW may be positioned at the upper and lower sides of the rear plate 300. The spread wings 300RW and 300LW may be located at the left and right sides of the rear plate 300. Such a structure can be advantageous for securing a viewing angle.

Figure 9:
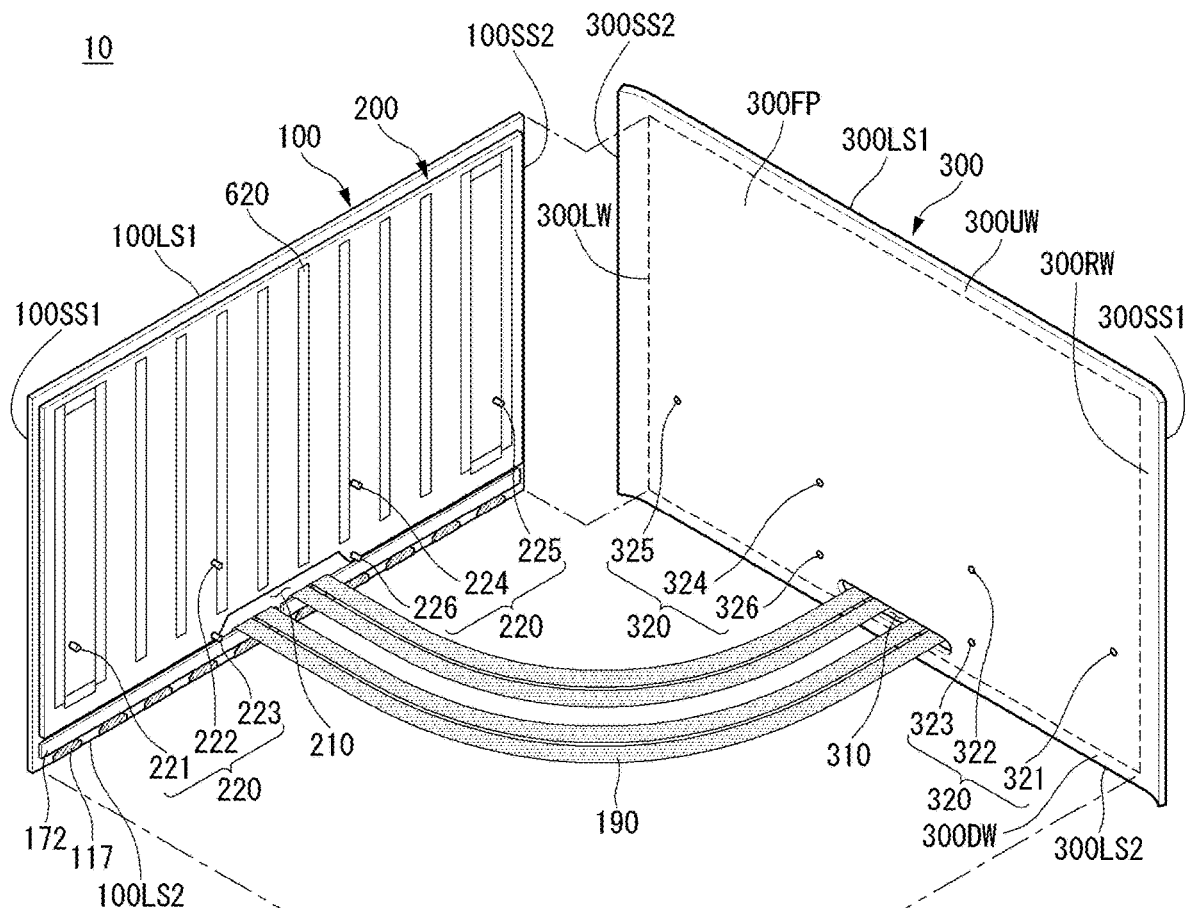

Referring to FIG. 9, the display panel 100 and the middle plate 200 may be accommodated in the rear plate 300. The display panel 100 and the middle plate 200 may be positioned on the flat plate portion 300FP of the rear plate 300. The middle plate 200 may be coupled to the rear plate 300.

The second adhesive member 620 may be attached to the rear surface of the middle plate 200. The second adhesive member 620 may not overlap with the coupling protrudes 220. The second adhesive member 620 may be attached to the front surface of the rear plate 300. The second adhesive member 620 can couple the middle plate 200 with the rear plate 300.

The left wing 300LW and the right wing 300RW can be bent and extended from the flat plate portion 300FP toward the front of the rear plate 300. The flat plate portion 300FP, the left wing 300LW, and the right wing 300RW can form an inner space. The inner space formed at the rear plate 300 can be opened toward a front of the rear plate 300. The inner space formed at the rear plate 300 can be opened toward the upper and lower sides of the rear plate 300.

The display panel 100 and the middle plate 200 may be accommodated in the inner space of the rear plate 300. The display panel 100 and the middle plate 200 may be positioned between the left wing 300LW and the right wing 300RW. The left wing 300LW and the right wing 300RW can protect the display panel 100 and the middle plate 200.

For example, the left wing 300LW and the right wing 300RW can protect the display panel 100 from the impact applied from the left side and/or the right side of the display device 10.

The left wing 300LW and the right wing 300RW may protrude more toward the front of the display panel 100 than the display panel 100. In this case, the left wing 300LW and the right wing 300RW can effectively protect the display panel 100.

A case that the upper wing 300UW, the lower wing 300DW, the left wing 300LW and the right wing 300RW are bent from the flat plate portion 300FP toward the front of the rear plate 300, can be considered. In this case, the inner space formed at the rear plate 300 can be opened toward the front of the rear plate 300.

A case that the upper wing 300UW, the left wing 300LW and the right wing 300RW are bent from the flat plate portion 300FP toward the front of the rear plate 300, can be considered. In this case, the inner space formed at the rear plate 300 can be opened toward the front and lower sides of the rear plate 300.

The slot 310 formed at the rear plate 300 may be overlapped with the cable receiving groove 210 formed at the middle plate 200.

The cable 190 may extend from the source PCB 172 toward the cable receiving groove 210. The cable 190 may be inserted into the slot 310. The cable 190 inserted in the slot 310 can pass through the slot 310.

The fastening holes 320 formed on the rear plate 300 may correspond to the coupling protrusions 220. For example, the first to sixth fastening holes 321 to 326 may correspond to the first to sixth coupling protrusions 221 to 226, respectively. The fastening holes 320 can receive the coupling protrusions 220. The coupling protrusions 220 can be fitted into the fastening holes 320.

The middle plate 200, the member layer 117 and the source PCB 172 may be positioned between the display panel 100 and the rear plate 300. The rear plate 300 can protect the member layer 117 and the source PCB 172.

Figure 10:
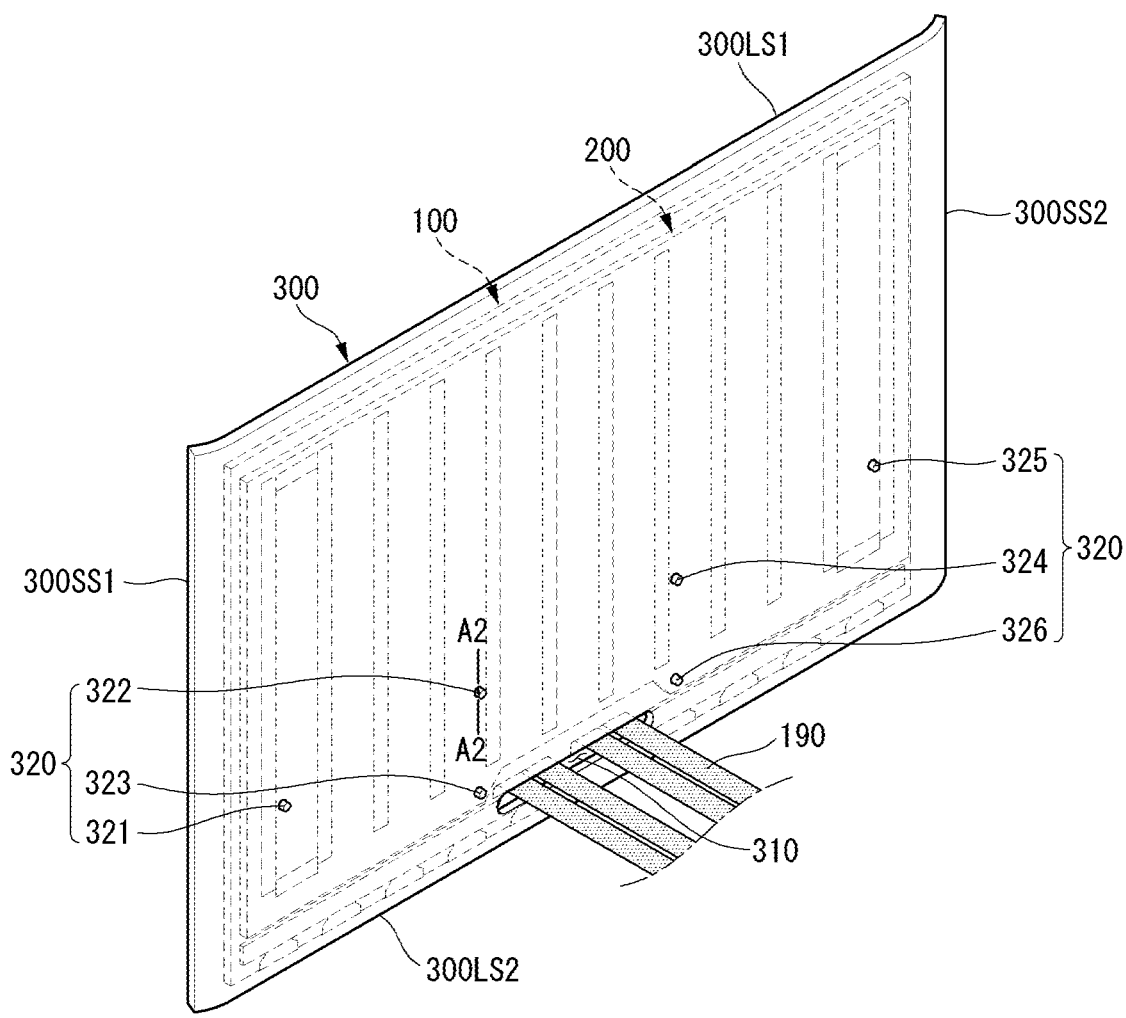

Referring to FIG. 10, the rear surface of the rear plate 300 can be observed while the middle plate 200 (see FIG. 9) and the rear plate 300 are coupled. Cable 190 may pass through slot 310. A portion of the cable 190 may be placed behind the rear plate 300.

The coupling protrusions 220 can be fastened to the corresponding fastening holes 320. The coupling protrusions 220 can pass through the corresponding fastening holes 320.

For example, the first to sixth coupling protrusions 221 to 226 can pass through the first to sixth fastening holes 321 to 326, respectively.

Figure 11:
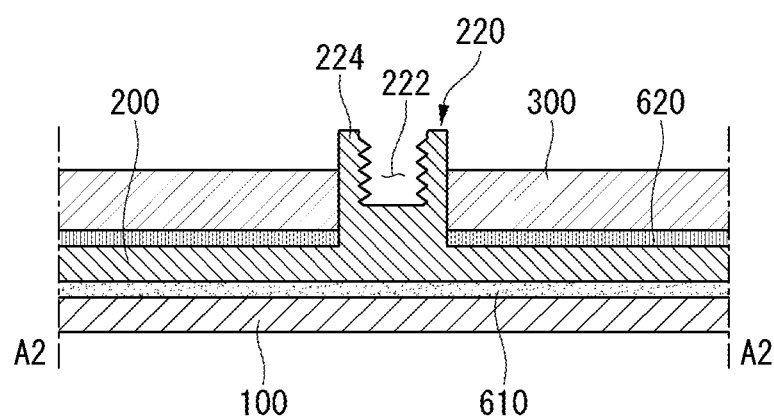

FIG. 11 is a cross-sectional view of the display device taken along line A2-A2 of FIG. 10.

Referring to FIG. 11, the display panel 100, the middle plate 200, and the rear plate 300 may be sequentially positioned in a direction from the front side to the rear side.

The first adhesive member 610 may be positioned between the display panel 100 and the middle plate 200. The second adhesive member 620 may be positioned between the middle plate 200 and the rear plate 300. The second adhesive member 620 can couple the middle plate 200 with the rear plate 300.

The coupling protrusions 220 may be formed on the rear surface of the middle plate 200 and protrude rearward of the middle plate 200. The coupling protrusions 220 can pass through the rear plate 300. The rear plate 300 can be mechanically fastened to the coupling protrusions 220.

Figure 12:
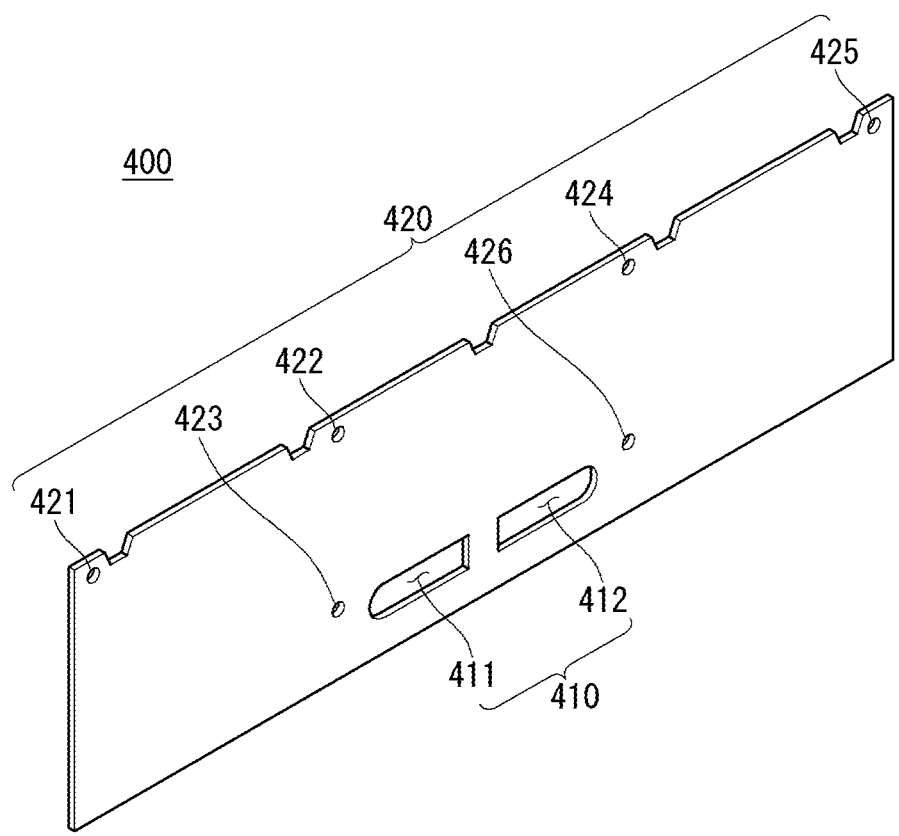

FIG. 12 is a view showing PCB plate.

Referring to FIG. 12, the rear surface of the PCB plate 400 can be observed. The rear surface of the PCB plate 400 can accommodate various electronic components. The PCB plate 400 may have a shape extending in a direction. The PCB plate 400 may include a cable hole 410.

The cable hole 410 may be formed on the PCB plate 400. The cable hole 410 may have a shape elongated in a direction. The cable hole 410 may be opened in the front-rear direction of the PCB plate 400. The cable hole 410 may be an opening.

The cable holes 410 may be provided in plural. For example, the cable hole 410 may include a first cable hole 411 and a second cable hole 412. The first cable hole 411 and the second cable hole 412 may be arranged in the elongation direction of the cable hole 410.

The PCB plate 400 may include a fastening hole 420. The fastening holes 420 may be formed on the PCB plate 400. The fastening hole 420 of the PCB plate 400 may be an opening. The fastening holes 420 of the PCB plate 400 may correspond to the coupling protrusions 220 (see FIG. 11) of the middle plate 200.

A plurality of fastening holes 420 of the PCB plate 400 may be provided. For example, the fastening holes 420 of the PCB plate 400 may include first to sixth fastening holes 421 to 426. The first to sixth fastening holes 421 to 426 of the PCB plate 400 can receive the first to sixth coupling protrusions 221 to 226 of the middle plate 200 (see FIG. 10).

Figure 13:
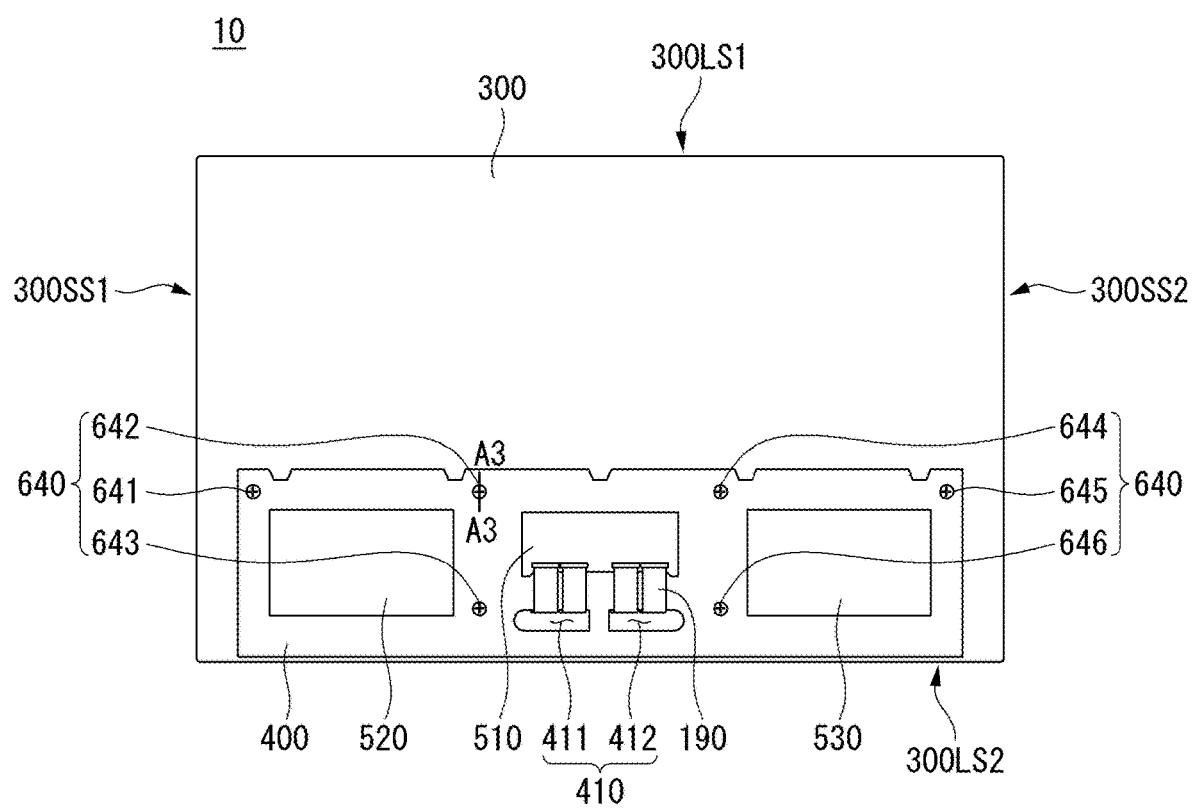

Referring to FIG. 13, the PCB plate 400 may be coupled to the rear surface of the rear plate 300. The rear surface of the PCB plate 400 can be observed. The PCB plate 400 may cover a part of the rear surface of the rear plate 300.

The PCB plate 400 may be adjacent to an edge of the rear plate 300. For example, the PCB plate 400 may be adjacent to the second long side 300LS2 of the rear plate 300.

The rear surface of the PCB plate 400 can accommodate the electronic parts. For example, the T-con board 510, the power supply 520, and the main board 530 can be seated on the rear surface of the PCB plate 400.

The cable 190 may pass through a cable hole 410 formed in the PCB plate 400. A portion of the cable 190 may be electrically connected to the T-con board 510 through the first cable hole 411. Another portion of the cable 190 may be electrically connected to the T-con board 510 through the second cable hole 412. The cable 190 may carry power and/or signals from the T-con board 510.

The fourth adhesive member 640 may be coupled to the PCB plate 400. The fourth adhesive member 640 may be referred to as a fourth fastening member 640. The fourth adhesive member 640 may be, for example, a screw 640. The fourth adhesive member 640 may be provided in plural. For example, the fourth fastening member 640 may include first to sixth screws 641 to 646.

The fourth adhesive member 640 may correspond to the fastening hole 420 (see FIG. 12) of the PCB plate 400. For example, the first to sixth screws 641 to 646 may correspond to the first to sixth fastening holes 421 to 426 of the PCB plate 400.

Figure 14:
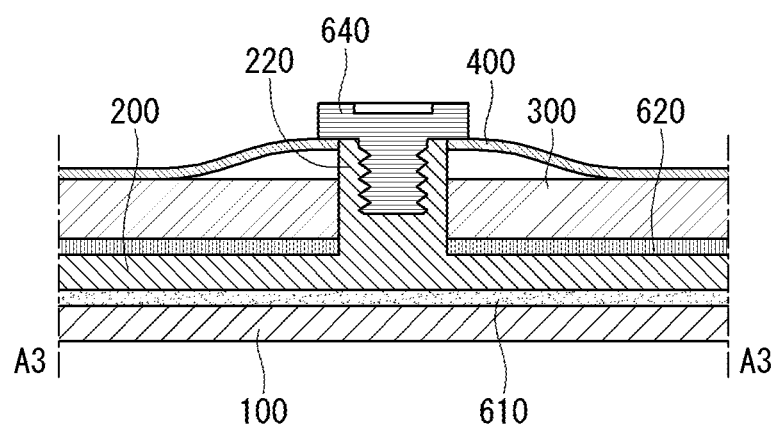

FIG. 14 is a cross-sectional view of the display device taken along line A3-A3 of FIG. 13.

Referring to FIG. 14, the display panel 100, the middle plate 200, the rear plate 300, and the PCB plate 400 may be sequentially positioned in a direction from the front side of the display device 10 to the rear side of the display device 10.

The coupling protrusion 220 protruding from the rear surface of the middle plate 200 can sequentially penetrate the rear plate 300 and the PCB plate 400. The screw 640 may be coupled with the coupling protrusion 220 at the rear of the PCB plate 400. The screw thread formed on the screw 640 can be engaged with a screw thread formed on the hollow portion of the coupling protrusion 200.

The rear plate 300 and the PCB plate 400 may be positioned between the head of the screw 640 and the middle plate 200, in the case that the screw 640 is coupled with the coupling protrusion 220. The PCB plate 400 can be coupled with the rear surface of the rear plate 300, when the screw 640 is fastened to the coupling protrusion 220.

Figure 15:
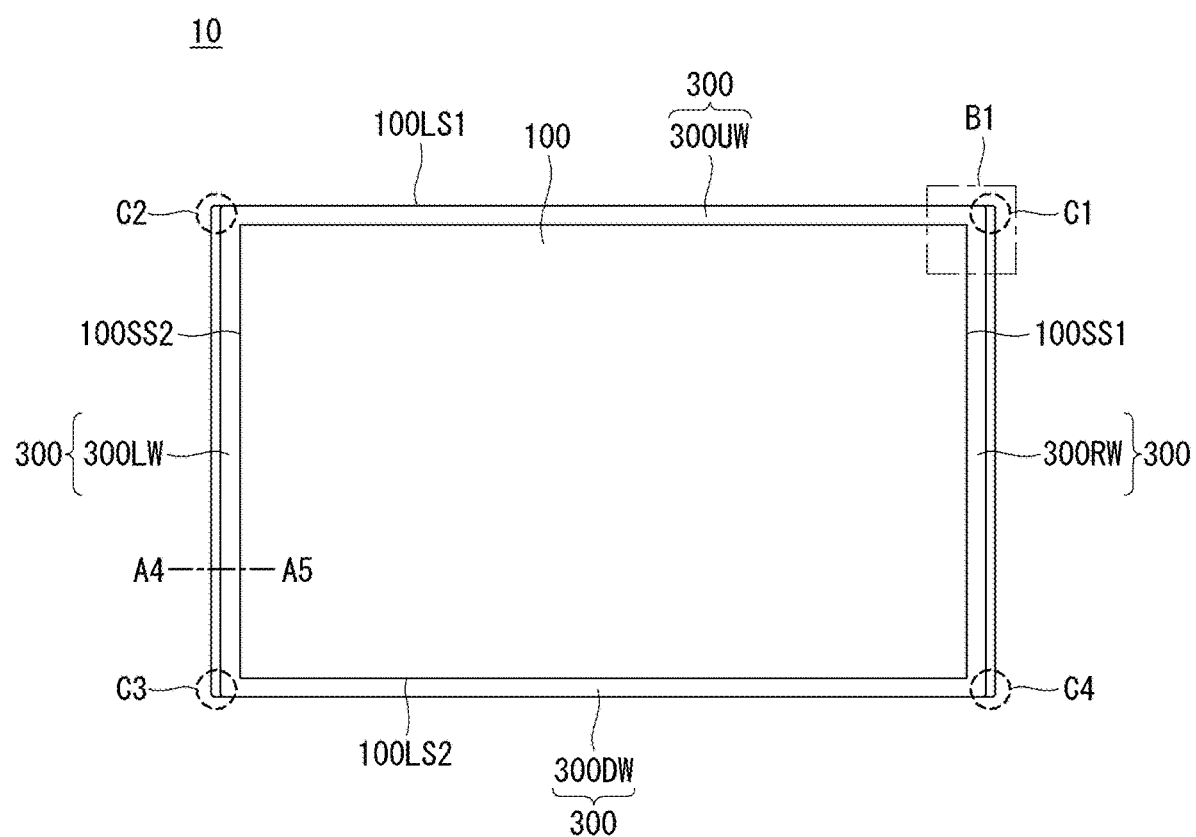
FIGS. 15 to 21 are views of display device including wings according to various embodiments of the present invention.

Referring to FIG. 15, a front view of the display device 10 according to an embodiment of the present invention may be displayed. The display panel 100 can be housed in the rear plate 300. In FIG. 15, the PCB plate 400 (see FIG. 13) may be omitted.

The front surface of the display panel 100 can be seen in front of the display panel 100. The front surface of the display panel 100 may form the first short side 100SS1, the first long side 100LS1, the second short side 100SS2 and the second long side 100LS2 of the display panel 100. The first short side 100SS1, the first long side 100LS1, the second short side 100SS2 and the second long side 100LS2 of the display panel 100 can define the entire surface of the display panel 100.

The display panel 100 may be positioned in front of the rear plate 300. The display panel 100 may cover a portion of the rear plate 300. Another portion of the rear plate 300 may not be covered by the display panel 100. For example, the upper wing 300UW, the lower wing 300DW, the right wing 300RW, and the left wing 300LW may face a front outside.

At least one of the upper wing 300UW, the lower wing 300DW, the right wing 300RW and the left wing 300LW may cover the sides or edges of the display panel 100. For example, the left wing 300LW may cover at least a portion of the second short side SS2 of the display panel 100. For example, the right wing 300RW may cover at least a portion of the first short side SS1 of the display panel 100.

The wing of the rear plate 300 may mean at least one of an upper wing 300UW, a lower wing 300DW, a right wing 300RW, and a left wing 300LW. The wings of the rear plate 300 can protect the display panel 100. For example, the left wing 300LW of the rear plate 300 can protect the second short side 100SS2 of the display panel 100. For example, the right wing 300RW of the rear plate 300 can protect the first short side 100SS1 of the display panel 100.

Figure 16:
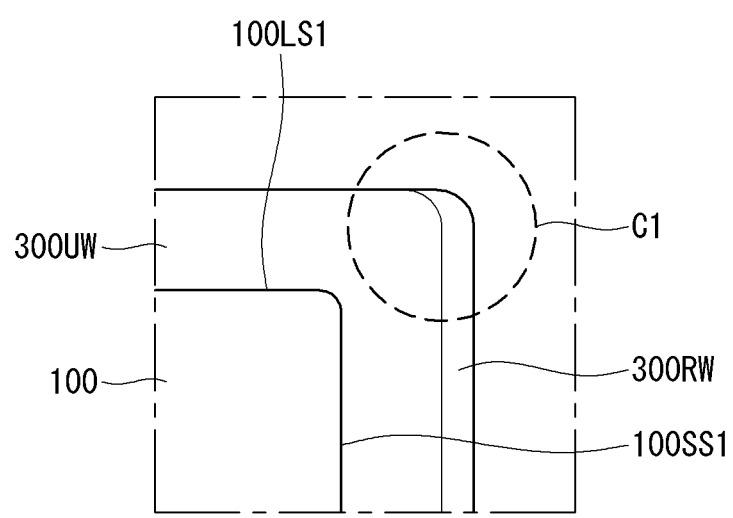

FIG. 16 is a diagram showing the B1 area of FIG. 15 in detail.

Referring to FIG. 16, the upper wing 300UW may be positioned at the rear of the display panel 100. The upper wing 300UW may be flat. The first long side 100LS1 of the display panel 100 may be opened upward. The upper wing 300UW may not cover the first long side 100LS1 of the display panel 100.

The right wing 300RW can meet the upper wing 300UW. The right wing 300RW may be formed extending from the upper wing 300UW. The right wing 300RW may have a bent shape. The right wing 300RW can be bent toward the front of the display panel 100 as compared with the upper wing 300UW.

The right wing 300RW may cover the first short side 100SS1 of the display panel 100. The first short side 100SS1 of the display panel 100 may be covered by the right wing 300RW. At least a portion of the first short side 100SS1 of the display panel 100 can be closed toward the right side.

Figure 17:
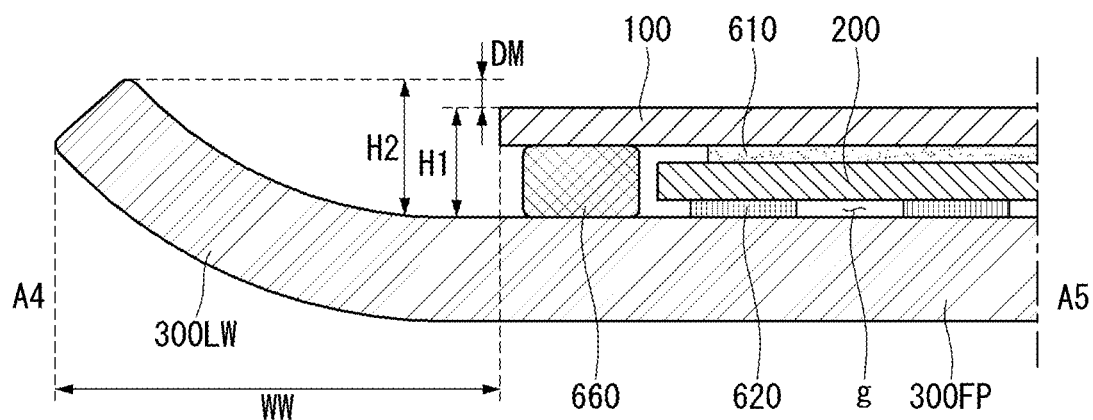

FIG. 17 is a cross-sectional view of the display device taken along line A4-A5 of FIG. 15. The relationship between the left wing 300LW and the flat plate portion 300FP described in FIG. 17 may mean the relationship between the wing of the rear plate 300 (see FIG. 15) and the flat plate portion 300FP. The wing of the rear plate 300 (see FIG. 15) may mean at least one among the left wing 300LW, the right wing 300RW, the upper wing 300UW, and the lower wing 300DW.

Referring to FIG. 17, the middle plate 200 may be positioned in front of the rear plate 300. The second adhesive member 620 can couple the middle plate 200 with the rear plate 300. The display panel 100 may be positioned in front of the middle plate 200. The first adhesive member 610 can couple the display panel 100 with the middle plate 200.

A gap g may be formed between the middle plate 200 and the rear plate 300. The display panel 100 may provide the middle plate 200 with heat. The middle plate 200 can emit heat toward the gap g. The air can pass through the gap g. Air passing through the gap g can be supplied with heat from the middle plate 200.

The display panel 100 may be larger than the middle plate 200. The blocking member 660 may be located beside the middle plate 200. An empty space may be formed between the display panel 100 and the rear plate 300.

The blocking member 660 may be positioned between the display panel 100 and the rear plate 300. The blocking member 660 may be located in the space formed between the display panel 100 and the rear plate 300. The blocking member 660 may be positioned alongside of an edge of the middle plate 200.

The blocking member 660 can be disposed alongside of an edge of the display panel 100. The blocking member 660 can couple the display panel 100 with the rear plate 300. For example, the blocking member 660 may include a double-sided adhesive tape. The blocking member 660 may include a black material.

The left wing 300LW of the rear plate 300 can be bent and extended from the flat plate portion 300FP of the rear plate 300 toward the front of the display panel 100. The left wing 300LW can be located at a front side with respect to the flat plate portion 300FP.

The left wing 300LW may cover at least a portion of a lateral surface formed between a front surface and a rear surface of the display panel 100. For example, the left wing 300LW may cover at least a portion of the edges 100LS1, 100LS2, 100 SS1, 100SS2 (see FIG. 15) formed on the front surface of the display panel 100.

The front surface of the display panel 100 may be positioned in front of the front surface of the rear plate 300 as much as a first distance H1. The left wing 300LW may extend forward from the rear plate 300 as much as a second distance H2. The left wing 300LW may extend from the flat plate portion 300FP of the rear plate 300 in the direction away from the right wing 300RW as much as the wing width WW.

The first distance H1 may be greater than the second distance H2. The margin distance DM may be the difference between the first distance H1 and the second distance H2. The margin distance DM may be greater than zero.

The left wing 300LW of the rear plate 300 can protect the display panel 100 more easily, as the margin distance DM is greater. The left wing 300LW of the rear plate 300 can block the view of the display panel 100 more, as the margin distance DM is greater. The viewing angle of the display panel 100 may get smaller, as the margin distance DM is greater. The margin distance DM can be optimized to compromise the protection of the display panel 100 and the viewing angle of the display panel 100.

Figure 18:
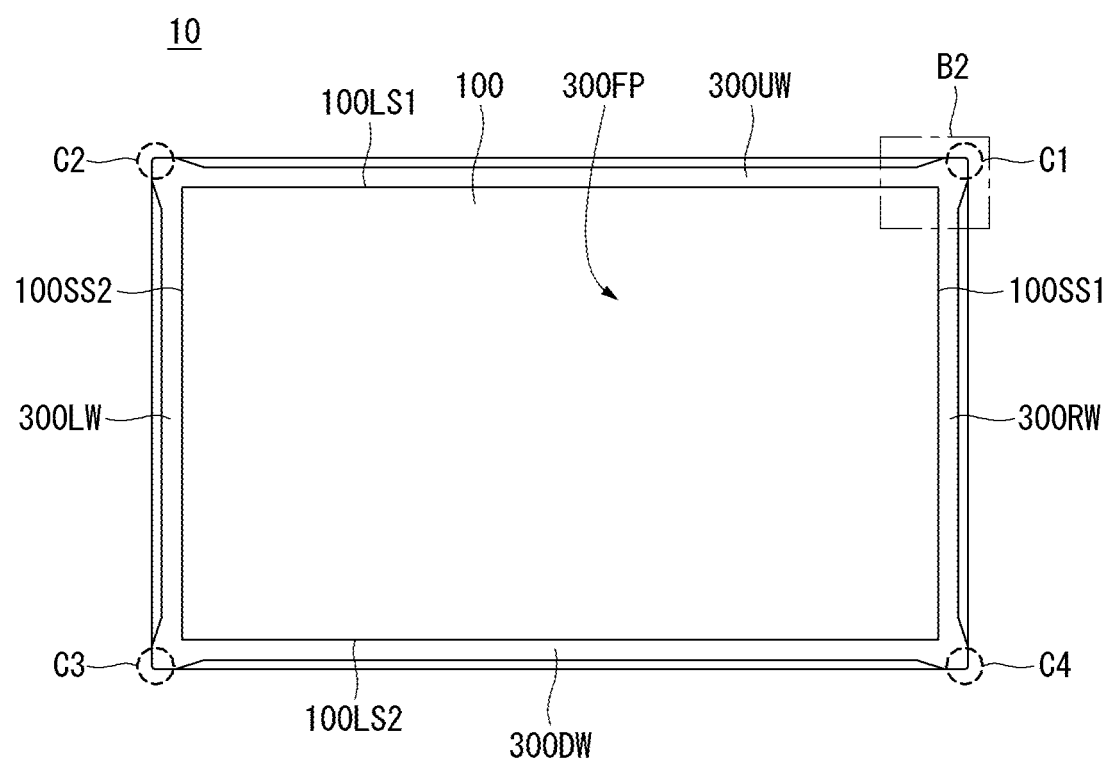

Referring to FIG. 18, the left wing 300LW, the right wing 300RW, the upper wing 300UW, and the lower wing 300DW, may be bent and extended from the flat plate portion 300FP toward the front of the flat plate portion 300FP. The flat plate portion 300FP may be placed behind of the display panel 100.

The right wing 300RW can be referred to as a first wing 300RW. The left wing 300LW may be referred to as a second wing 300LW. The upper wing 300UW can be referred to as a third wing 300UW. The lower wing 300DW may be referred to as a fourth wing 300DW.

At least a portion of the left wing 300LW can be seen at the first short side 100SS1 of the display panel 100. The left wing 300LW may be bent toward the right wing 300RW.

At least a portion of the right wing 300RW can be seen at the second short side 100SS2 of the display panel 100. The right wing 300RW may be bent toward the left wing 300LW. The front surface of the right wing 300RW can obliquely face the front surface of the left wing 300LW.

At least a portion of the upper wing 300UW can be seen at the second long side 100LS2 of the play panel 100. The upper wing 300UW may be bent toward the lower wing 300DW.

At least a portion of the lower wing 300DW can be seen at the second long side 100LS2 of the display panel 100. The lower wing 300DW may be bent toward the upper wing 300UW. The front surface of the lower wing 300DW can obliquely face the front surface of the upper wing 300UW.

The wings of the rear plate 300 may be integrally formed with the flat plate portion 300FP of the rear plate 300. For example, the rear plate 300 can be formed through the process that melted material is poured into a cast and hardened. For another example, the rear plate 300 can be formed through the process that the rear plate 300 in a flat state is pressed and bent.

The wing of the rear plate 300 may refer to a bent portion of the rear plate 300. The wings of the rear plate 300 may be positioned in the same plane when the flat plate portion 300FP has not been bent yet.

The upper wing 300 UW and the right wing 300 RW may be positioned in the same plane as the flat plate portion 300FP before being bent. The upper wing 300UW may be formed by being bent toward the lower wing 300DW. The right wing 300RW may be formed by being bent toward the left wing 300LW.

The direction in which the upper wing 300UW is bent may be different from the direction in which the right wing 300RW is bent. The upper wing 300UW and the right wing 300RW can meet at the first corner C1. The bent direction of the rear plate 300 at the first corner C1 can be directed to the left wing 300LW and the lower wing 300DW. In this case, there may be a concern that a phenomenon (hereinafter referred to as a "wrinkle phenomenon") that the rear plate 300 at the first corner C1 may wrinkle.

The wrinkle phenomenon at the first corner C1 can be suppressed if the degree of bending of the upper wing 300UW becomes smaller the closer to the first corner C1 from the center of the upper wing 300UW. The wrinkle phenomenon at the first corner C1 can be suppressed if the degree of bending of the right wing 300RW becomes smaller the closer to the first corner C1 from the center of the right wing 300RW.

The wrinkle phenomenon at the second corner C2 can be suppressed if the degree of bending of the upper wing 300UW becomes smaller the closer to the second corner C2 from the center of the upper wing 300UW. The wrinkle phenomenon at the second corner C2 can be suppressed if the degree of bending of the left wing 300LW becomes smaller the closer to the second corner C2 from the center of the left wing 300LW.

The wrinkle phenomenon at the third corner C3 can be suppressed if the degree of bending of the lower wing 300DW becomes smaller the closer to the third corner C3 from the center of the lower wing 300DW. The wrinkle phenomenon at the third corner C3 can be suppressed if the degree of bending of the left wing 300LW becomes smaller the closer to the third corner C3 from the center of the left wing 300LW.

The wrinkle phenomenon at the fourth corner C4 can be suppressed if the degree of bending of the lower wing 300DW becomes smaller the closer to the fourth corner C4 from the center of the lower wing 300DW. The wrinkle phenomenon at the fourth corner C4 can be suppressed if the degree of bending of the right wing 300RW becomes smaller the closer to the fourth corner C4 from the center of the right wing 300RW.

The first corner C1 may be adjacent to a point where the first edge 100SS1 of the display panel 100 meets the third edge 100LS1 of the display panel 100. The second corner C2 may be adjacent to a point where the second edge 100SS2 of the display panel 100 meets the third edge 100LS1 of the display panel 100. The third corner C3 may be adjacent to a point where the second edge 100SS2 of the display panel 100 meets the fourth edge 100LS2 of the display panel 100. The fourth corner C4 may be adjacent to a point where the first edge 100SS1 of the display panel 100 meets the fourth edge 100LS2 of the display panel 100.

The first wing 300RW and the third wing 300UW may be adjacent to the first corner C1 and spaced apart from the first corner C1. The second wing 300LW and the third wing 300UW may be adjacent to the second corner C2 and spaced apart from the second corner C2. The second wing 300LW and the fourth wing 300DW may be adjacent to the third corner C3 and spaced apart from the third corner C3. The first wing 300RW and the fourth wing 300DW may be adjacent to the fourth corner C4 and spaced apart from the fourth corner C4.

Figure 19:
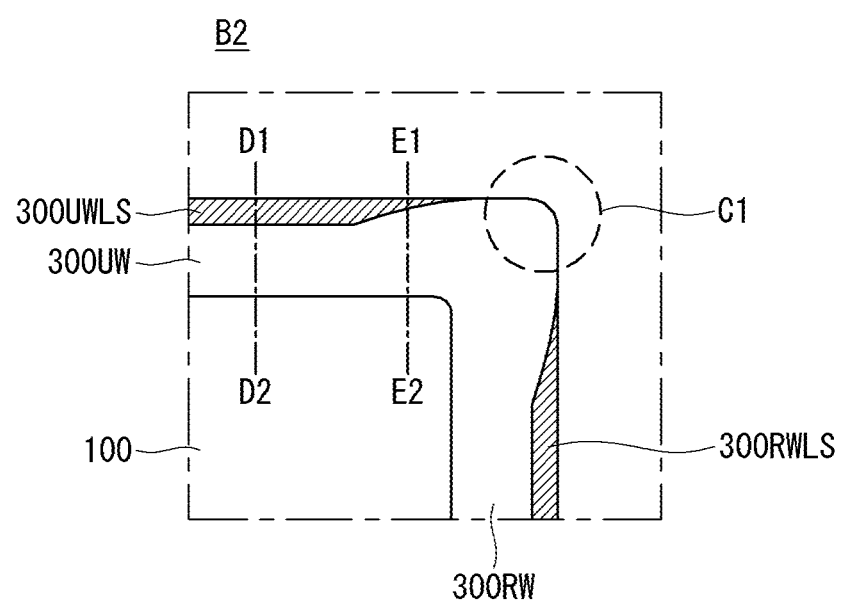

FIG. 19 is a view showing B2 in FIG. 18. Referring to FIG. 19, the upper wing 300UW, the right wing RW, and the front surface of the display panel 100 can be seen at a region adjacent to the first corner C1.

The front side of the upper wing 300UW can be seen. As the upper wing 300UW is bent, a lateral surface 300UWLS of the upper wing 300UW can be seen from the front of the display panel 100. In FIG. 19, the lateral surface 300UWLS of the upper wing 300UW can be represented by hatching.

The front side of the right wing 300RW can be seen. As the right wing 300RW is bent, a lateral surface 300RWLS of the right wing 300RW can be seen from the front of the display panel 100. In FIG. 19, the lateral surface 300RWLS of the right wing 300RW can be represented by hatching.

The width of the lateral surface 300UWLS of the upper wing 300UWLS viewed from the front of the display panel 100 may have a positive correlation with the degree of bending of the upper wing 300UW. The width of the lateral surface 300UWLS of the upper wing 300UW viewed from the front of the display panel 100 may become narrower toward the first corner C1. The degree of bending of the upper wing 300UW can be smaller as it is closer to the first corner C1.

The width of the lateral surface 300RWLS of the right wing 300RWLS viewed from the front of the display panel 100 may have a positive correlation with the degree of bending of the right wing 300UW. The width of the lateral surface 300RWLS of the right wing 300RW viewed from the front of the display panel 100 may become narrower toward the first corner C1. The degree of bending of the right wing 300UW can be smaller as it is closer to the first corner C1.

Figure 20:
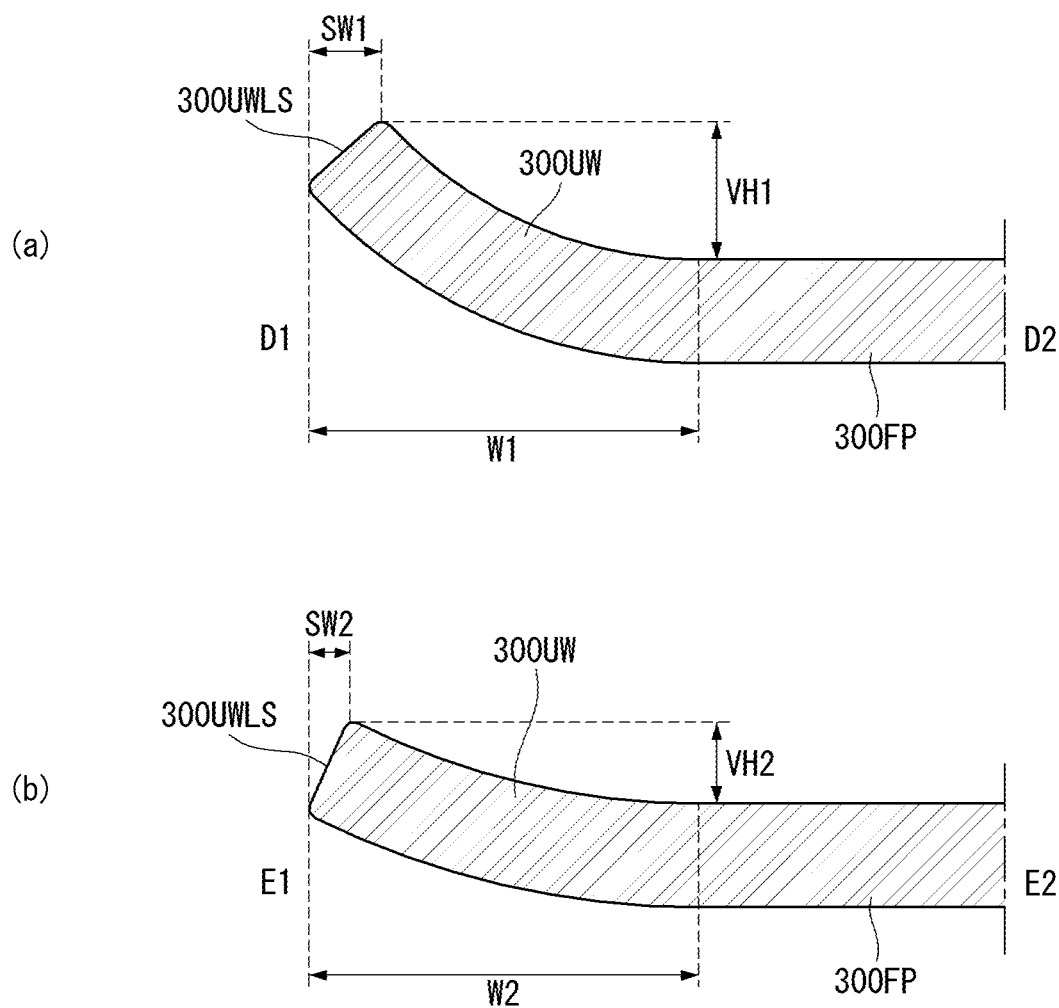

FIG. 20 is a cross-sectional view of the rear plate of FIG. 19.

Referring to FIG. 20 (a), a cross section of the rear plate 300 taken along D1-D2 of FIG. 19 may be shown. The upper wing 300UW may extend from the flat plate portion 300FP of the rear plate 300.

The upper wing 300UW may extend from the flat plate portion 300FP as much as the first variable distance VH1 toward the front of the flat plate portion 300FP. The upper wing 300UW may extend from the flat plate portion 300FP as much as the first width W1 toward the lateral side of the flat plate portion 300FP.

The lateral side of the flat plate portion 300FP may mean a direction in which the boundary between the flat plate portion 300FP and the upper wing 300UW extends from the center of the flat plate portion 300FP.

The lateral surface 300UWLS of the upper wing 300UW can be seen from the front of the flat plate portion 300FP. The width of the lateral side 300UWLS of the upper wing 300UW viewed from the front of the flat plate portion 300FP may be the first side width SW1.

Referring to FIG. 20 (b), a cross section of the rear plate 300 taken along E1-E2 of FIG. 19 may be shown. The upper wing 300UW may extend from the flat plate portion 300FP as much as the second variable distance VH2 toward the front of the flat plate portion 300FP. The upper wing 300UW may extend from the flat plate portion 300FP as much as the second width W2 toward the lateral side of the flat plate portion 300FP. The width of the lateral side 300UWLS of the upper wing 300UW viewed from the front of the flat plate portion 300FP may be the second side width SW2.

E1-E2 may be more adjacent to the first corner C1 than D1-D2 is. The first width W1 may be substantially the same as the second width W2. The first variable distance VH1 may be larger than the second variable distance VH2. The bending degree of the upper wing 300UW at the position of D1-D2 may be greater than the bending degree of the upper wing 300UW at the position of E1-E2.

As the bending degree of the upper wing 300UW is greater, the width of the lateral surface 300UWLS of the upper wing 300UW viewed from the front of the flat plate portion 300FP may be greater. The first side width SW1 may be greater than the second side width SW2.

Figure 21:
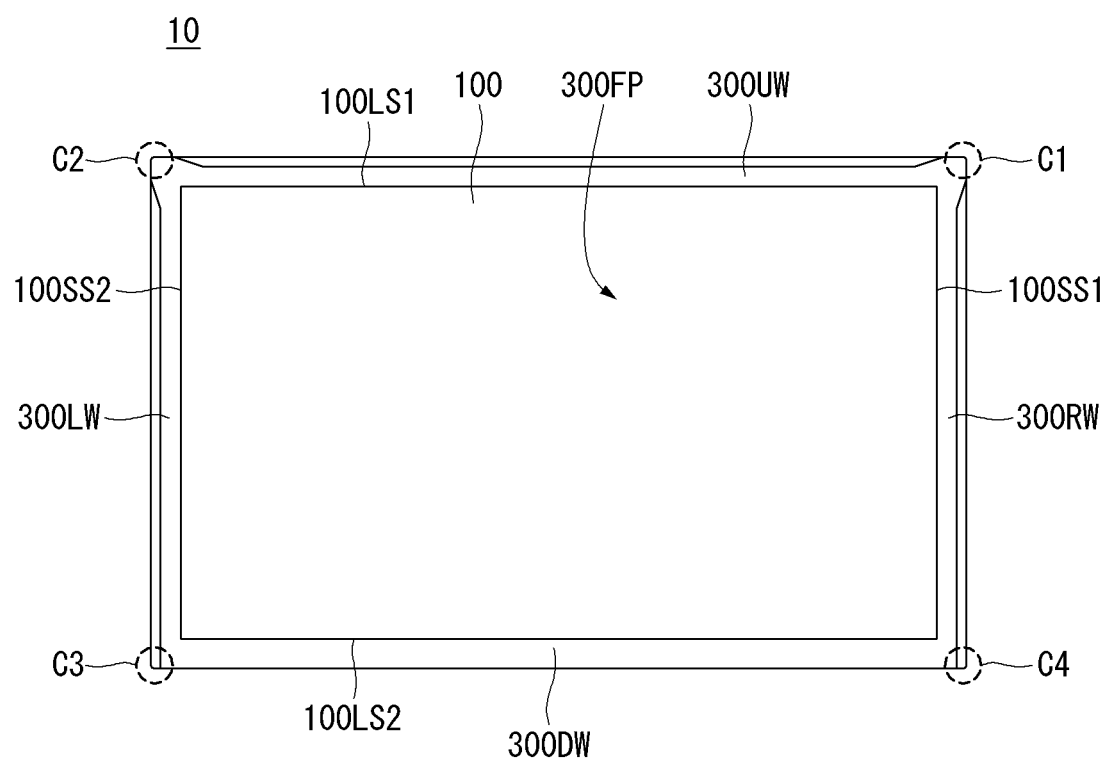

Referring to FIG. 21, the rear plate 300 may be positioned behind the display panel 100. The display panel 100 may be positioned in front of the flat plate portion 300FP. The display panel 100 may cover the flat plate portion 300FP of the rear plate 300.

The left wing 300LW, the upper wing 300UW and the right wing 300RW can be bent and extended from the flat plate 300FP toward the front of the flat plate 300FP. The lower wing 300DW may extend from the flat plate portion 300FP below the flat plate portion 300FP. The lower wing 300DW can be connected or fastened to a support structure.

The first corner C1 and the second corner C2 of the rear plate 300 may be similar to the first corner C1 and the second corner C2 of the rear plate 300 shown in FIG. 18. The third corner C3 and the fourth corner C4 of the rear plate 300 may be similar to the third corner C3 and the fourth corner C4 of the rear plate 300 shown in FIG. 15.

The structural stability of the rear plate 300 shown in FIG. 21 in the vertical direction can be superior to the structural stability of the rear plate 300 shown in FIG. 18 in the vertical direction. The structural stability of the rear plate 300 shown in FIG. 18 in the horizontal direction can be superior to the structural stability of the rear plate 300 shown in FIG. 21 in the horizontal direction.

The degree to which the rear plate 300 shown in FIG. 18 protects the display panel 100 may be greater than the degree to which the rear plate 300 shown in FIG. 21 protects the display panel 100.

Referring to FIG. 22, a cross-section of the rear plate 300 can be seen. The manufacturing process of the rear plate 300 may represent, for example, a manufacturing process of the rear plate 300 shown in FIG. 15.

The rear plate 300 may include a flat plate portion 300FP, a left wing 300LW, and a right wing 300RW. The right wing 300RW may be referred to as a first wing 300RW. The left wing 300LW may be referred to as a second wing 300LW. The first wing 300RW may be positioned opposite the second wing 300LW.

Referring to FIG. 22 (a), the rear plate 300 in a state before the first wing 300RW and the second wing 300LW are bent from the flat plate 300FP can be seen. The rear plate 300 may have a flat plate shape. For example, in this state, the rear plate 300 may include a float glass.

The presser 710 and 720 can be positioned in the front-rear direction of the rear plate 300. The pressers 710 and 720 may include a first presser 710 and a second presser 720. The first presser 710 may be located behind the rear plate 300. The second presser 720 may be located in front of the rear plate 300.

The first presser 710 may include a flat surface 710F and a curved surface 710B. The flat surface 710F and the curved surface 710B may be formed on the first presser 710. The flat surface 710F and the curved surface 710B may face the rear surface of the rear plate 300.

The curved surface 710B may extend from the flat surface 710F and may be curved toward the rear plate 300. The curved surface 710B may include a first curved surface 710B1 and a second curved surface 710B2. The flat surface 710F may be positioned between the first curved surface 710B1 and the second curved surface 710B2.

The second presser 720 may include a flat surface 720F and a curved surface 720B. The flat surface 720F of the second presser 720 may have a shape corresponding to the flat surface 710F of the first presser 710. The curved surface 720B of the second presser 720 may have a shape corresponding to the curved surface 710B of the first presser 710.

The first presser 710 may include a heat generating portion 715. The heat generating portion 715 may be adjacent to the curved surface 710B of the first presser 710. The heat generating portion 715 may be adjacent to the boundary between the curved surface 710B of the first presser 710 and the flat surface 710F of the first presser 710.

The heat generating portion 715 may include a first heat generating portion 715a and a second heat generating portion 715b. The heat generating portion 715 can provide heat at the region adjacent to the boundary between the curved surface 710B and the flat surface 710F and/or at the region adjacent to the curved surface 710B. The first heat generating portion 715a can provide heat to the first curved surface 710B1. The second heat generating portion 715b can provide heat to the second curved surface 710B2.

Referring to FIG. 22 (b), the first presser 710 and the second presser 720 can apply pressure on the rear plate 300. The first presser 710 can apply pressure on the rear plate 300 toward the second presser 720. The second presser 720 can apply pressure on the rear plate 300 toward the first presser 710. The pressure applied to the rear plate 300 by the first presser 710 may be substantially equal to the pressure applied to the rear plate 300 by the second presser 720.

The heat generating portion 715 can apply heat to the curved surface 710B of the first presser 710. The heat generating portion 715 can apply heat to the region adjacent to the boundary between the curved surface 710B and the flat surface 710F. The rear plate 300 can be provided heat from the heat generating unit 715. The heat supplied to the rear plate 300 can be used to bend the rear plate 300.

The rear plate 300 can be bent in correspondence with the shape between the first presser 710 and the second presser 720, when the rear plate 300 is provided pressure and heat from the pressers 710 and 720. For example, the first wing 300RW of the rear plate 300 can be bent in correspondence with the shape of the pressers 710 and 720. For example, the second wing 300LW of the rear plate 300 may be bent in correspondence with the shape of the pressers 710 and 720.

Referring to FIG. 22 (c), the first wing 300RW and the second wing 300LW may extend from the flat plate portion 300FP and may be bent toward the front of the flat plate portion 300FP. The first wing 300RW can obliquely face the second wing 300LW. The first wing 300RW, the flat plate portion 300FP, and the second wing 300LW can form an accommodation space.

The thickness of the first wing 300RW may be substantially the same as the thickness of the second wing 300LW. The thickness of the first wing 300RW may be substantially the same as the thickness of the flat plate portion 300FP. The thickness of the rear plate 300 can be kept uniform.

Figure 23:
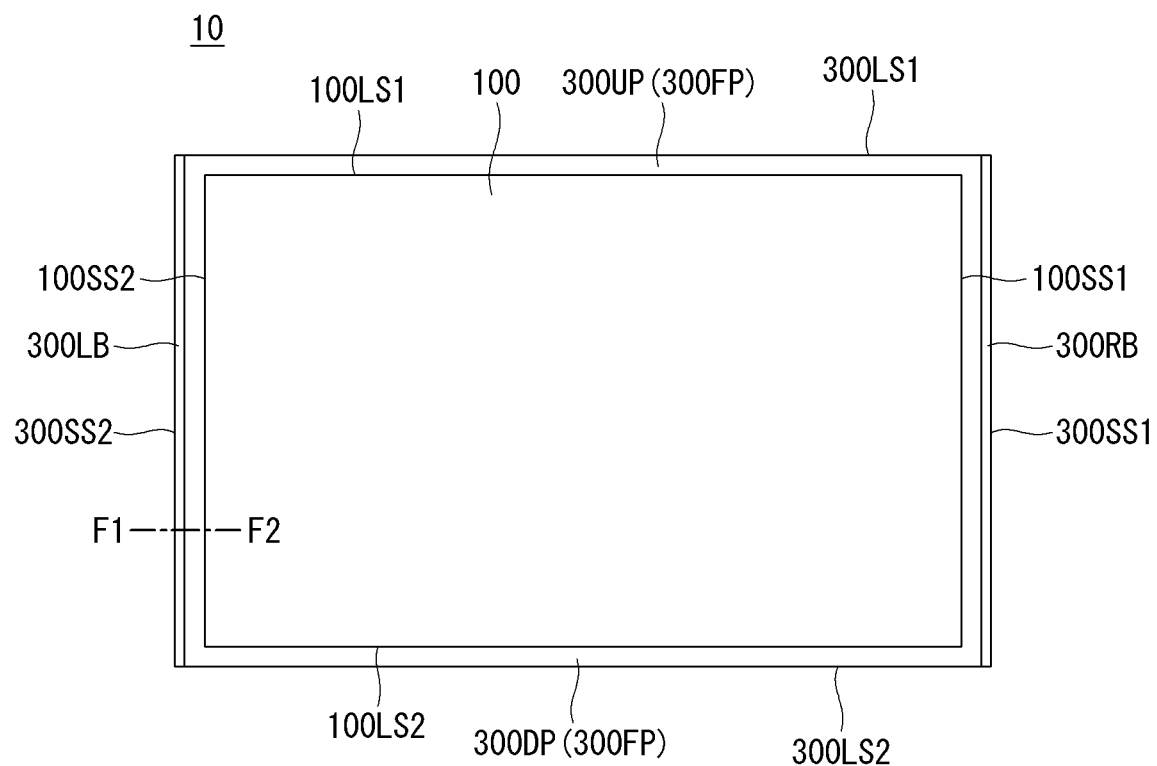
FIGS. 23 to 25 are views of display device including banks according to various embodiments of the present inventions.

Referring to FIG. 23, the display panel 100 may be positioned in front of the rear plate 300. The rear plate 300 may include a flat plate portion 300FP, a left bank 300LB, and a right bank 300RB. The flat plate portion 300FP may have the shape of a flat plate. The flat plate portion 300FP may be located behind the display panel 100.

The right bank 300RB may be formed alongside of the first short side 100SS1 of the display panel 100. The right bank 300RB can be positioned on the front surface of the flat plate portion 300FP. The right bank 300RB may protrude forward from the flat plate portion 300FP. The right bank 300RB can form the first short side 300SS1 of the rear plate 300.

The right bank 300RB and the left bank 300LB may have a shape protruding from the flat plate portion 300FP. The flat plate portion 300FP, the right bank 300RB, and the left bank 300LB can form an accommodation space. The display panel 100 can be accommodated in the accommodation space formed by the flat plate portion 300FP, the right bank 300RB, and the left bank 300LB. The right bank 300RB and the left bank 300LB can provide stereoscopic properties to the rear plate 300. The right bank 300RB and the left bank 300LB can provide a stable structure to the rear plate 300. For example, the vertical stability of the rear plate 300 can be improved by the right bank 300RB and the left bank 300LB. The right bank 300RB and the left bank 300LB can provide rigidity to the rear plate 300 or to the flat plate portion 300FP. For example, the right bank 300RB and the left bank 300LB may provide torsional stiffness to the rear plate 300 or to the flat plate portion 300FP.

The upper portion 300UP of the flat plate portion 300FP may be formed alongside of the first long side 100LS1 of the display panel 100. The lower portion 300DP of the flat plate portion 300FP may be formed alongside of the second long side 100LS2 of the display panel 100.

The flat plate portion 300FP may form a slot. The slot formed in the flat plate portion 300FP may be similar to the slot 310 (see FIG. 8). The flat plate portion 300FP can form a fastening hole. The fastening holes formed in the flat plate portion 300FP may be similar to the fastening holes 320 (see FIG. 8).

Figure 24:
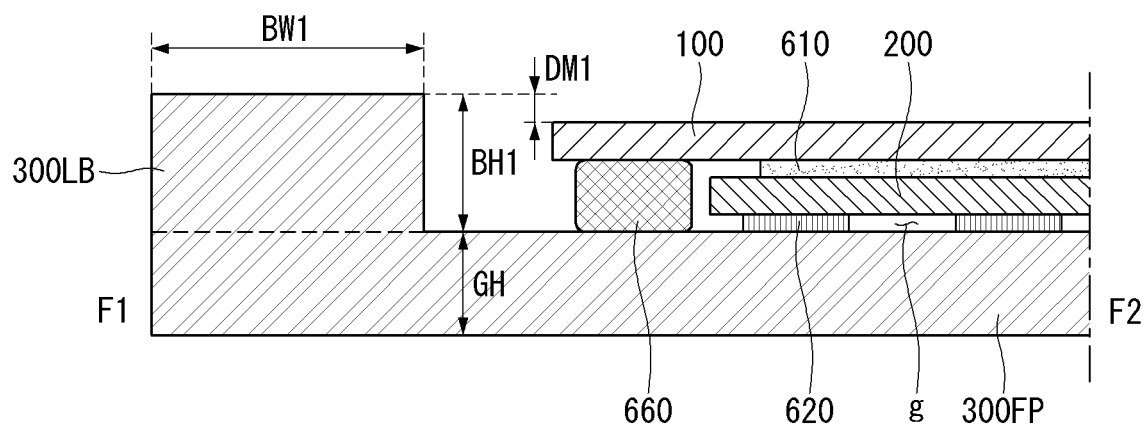

The relations between the right bank 300RB (see FIG. 23) and the flat plate portion 300FP may be the same as or similar to the relations between the left bank 300LB and the flat plate portion 300FP. The flat plate portion 300FP may have a thickness as much as the first glass thickness GH1 in the front-rear direction. FIG. 24 is a cross-sectional view of the display device taken along line F1-F2 of FIG. 23.

Referring to FIG. 24, the left bank 300LB may extend from the front surface of the flat plate portion 300FP toward the front of the flat plate portion 300FP. The left bank 300LB may protrude from the front surface of the flat plate portion 300FP toward the front of the flat plate portion 300FP as much as the first bank height BH1. The left bank 300LB may have a width in the outward direction from the display panel 100 as much as the first bank width BW1.

The front surface of the left bank 300LB may protrude from the front surface of the display panel 100 toward the front of the display panel 100 as much as a first margin distance DM1. The first margin distance DM1 may be greater than zero.

The first margin distance DM1 may be related to the protection of the display panel 100. The protection of the display panel 100 by the left bank 300LB may have a positive correlation with the first margin distance DM1. As the first margin distance DM1 is greater, the display panel 100 may be protected by the left bank 300LB with higher efficiency.

The first margin distance DM1 may be related to the viewing angle of the display panel 100. The viewing angle of the display panel 100 may have a negative correlation with the first margin distance DM1. The smaller the first margin distance DM1, the larger the viewing angle of the display panel 100 can be. The first margin distance DM1 can be optimized by compromising the protection of the display panel 100 and the viewing angle of the display panel 100.

The rear plate 300 may have a different thickness depending on the spots or the points on the rear plate 300. The thickness of the rear plate 300 at the point where the display panel 100 and/or the middle plate 200 are seated may be the first glass thickness GH1. The thickness of the rear plate 300 at the point where the bank 300LB of the rear plate 300 is positioned may be the sum of the first glass thickness GH1 and the first bank height BH1.

Figure 25:
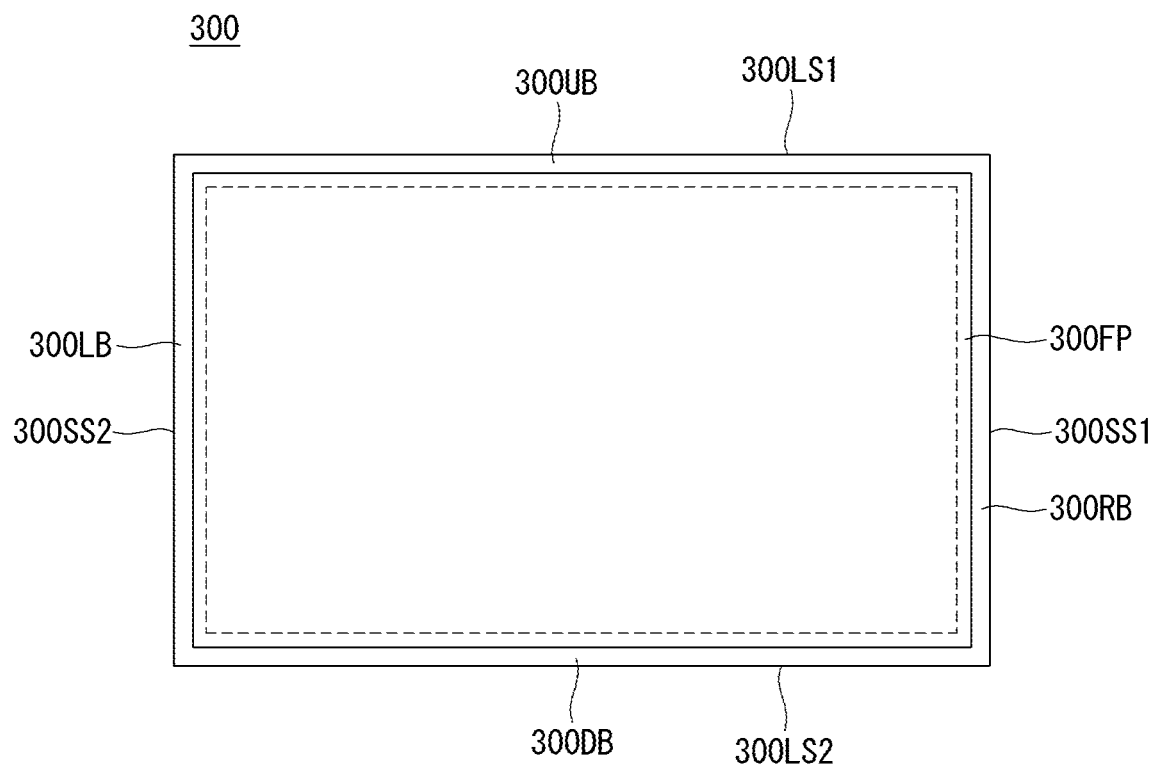

Referring to FIG. 25, the rear plate 300 may include a flat plate portion 300FP, a left bank 300LB, a right bank 300RB, an upper bank 300UB, and a lower bank 300DB. The left bank 300LB can be referred to as a left wing 300LB. The right bank 300RB can be referred to as a right wing 300RB. The upper bank 300UB can be referred to as an upper wing 300UB. The lower bank 300DB may be referred to as a lower wing 300DB. The dotted line indicated on the front surface of the flat plate portion 300FP may be a region where the display panel 100 (see FIG. 23) is seated.

The right bank 300RB can form the first short side 300SS1 of the rear plate 300. The left bank 300LB can form the second short side 300SS2 of the rear plate 300. The left bank 300LB may be located opposite the right bank 300RB. The display panel 100 (see FIG. 23) can be positioned between the left bank 300LB and the right bank 300RB. The display panel 100 (see FIG. 23) can be positioned in front of the flat plate portion 300FP.

The upper bank 300UB can form the first long side 300LS1 of the rear plate 300. The left end of the upper bank 300UB may be connected to the left bank 300LB. The right end of the upper bank 300UB may be connected to the right bank 300RB.

The lower bank 300DB can form the second long side 300LS2 of the rear plate 300. The left end of the lower bank 300DB may be connected to the left bank 300LB. The right end of the lower bank 300DB may be connected to the right bank 300RB. The lower bank 300DB may be located on the opposite side of the upper bank 300UB. The display panel 100 (see FIG. 23) can be positioned between the upper bank 300UB and the lower bank 300DB. The display panel 100 (see FIG. 23) can be positioned in front of the flat plate portion 300FP.

The bank of the rear plate 300 may be at least one of the right bank 300RB, the left bank 300LB, the upper bank 300UB, and the lower bank 300DB. The bank of the rear plate 300 can provide a stable structure to the rear plate 300. The bank of the rear plate 300 can provide rigidity to the rear plate 300. For example, the bank of the rear plate 300 can provide a torsional stiffness to the rear plate 300.

Figure 26:
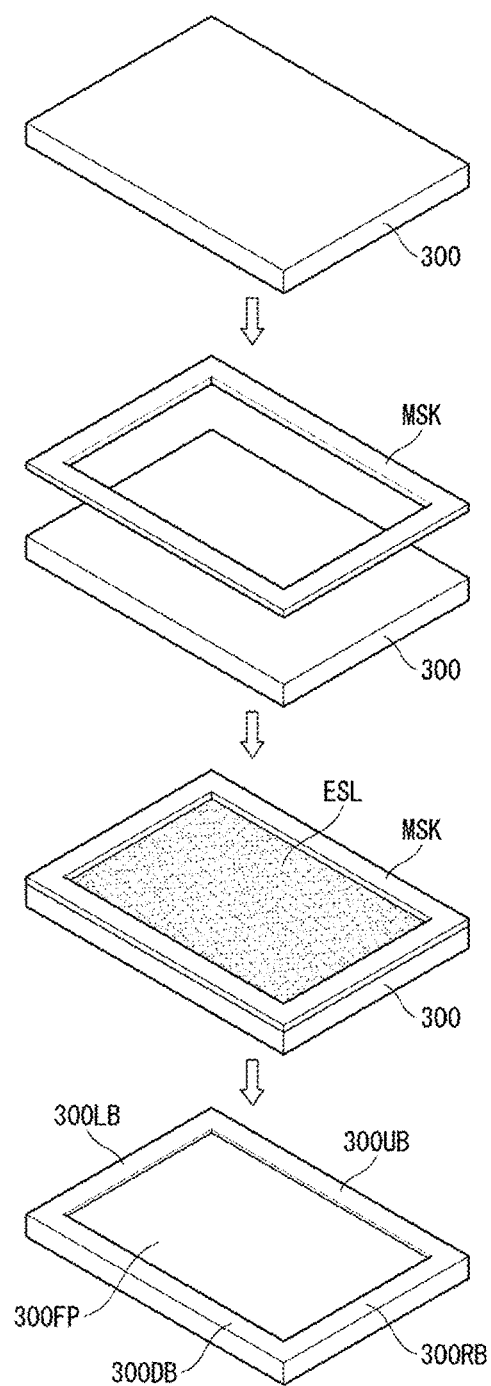
FIGS. 26 to 28 are views showing manufacturing processes of rear plate with banks.

Referring to FIG. 26, a rear plate 300 having a flat plate shape may be provided. The mask MSK may be positioned on the rear plate 300 of the flat plate shape. The mask MSK may have the shape of a photo frame. The mask MSK may have a thickness.

The mask MSK may be located on the front surface of the rear plate 300 along the perimeter of the rear plate 300. The mask MSK and the rear plate 300 can form a space open toward the front of the rear plate 300.

The etching solution ESL may be contained in the space formed by the mask MSK and the rear plate 300. The etching solution ESL can chemically etch a region of the rear plate 300 exposed to the etching solution ESL. The etching solution ESL may contain, for example, a hydrofluoric acid. The mask MSK may have resistance to the etching solution ESL. The mask MSK can protect the rear plate 300 from the etching solution ESL.

Although not shown in the drawing, the rear plate 300 may be etched by plasma. The mask MSK may have resistance to plasma. The plasma may be, for example, an atmospheric plasma. Although not shown in the drawings, the rear plate 300 can be etched by a laser. The mask MSK may have resistance to the laser. The laser may be, for example, a carbon dioxide laser.

After the etching is performed, the mask MSK can be separated from the rear plate 300. The flat plate-like rear plate 300 may be transformed to a stepped shape after the etching is performed. The region facing the mask MSK can be a bank of the rear plate 300. The bank of the rear plate 300 may include, for example, a left bank 300LB, a right bank 300RB, an upper bank 300UB, and a lower bank 300DB. The region exposed to the etching solution ESL may be a part of the flat plate portion 300FP. By the etching, the thickness of the bank of the rear plate 300 may be greater than the thickness of the flat plate portion 300FP.

Figure 27:
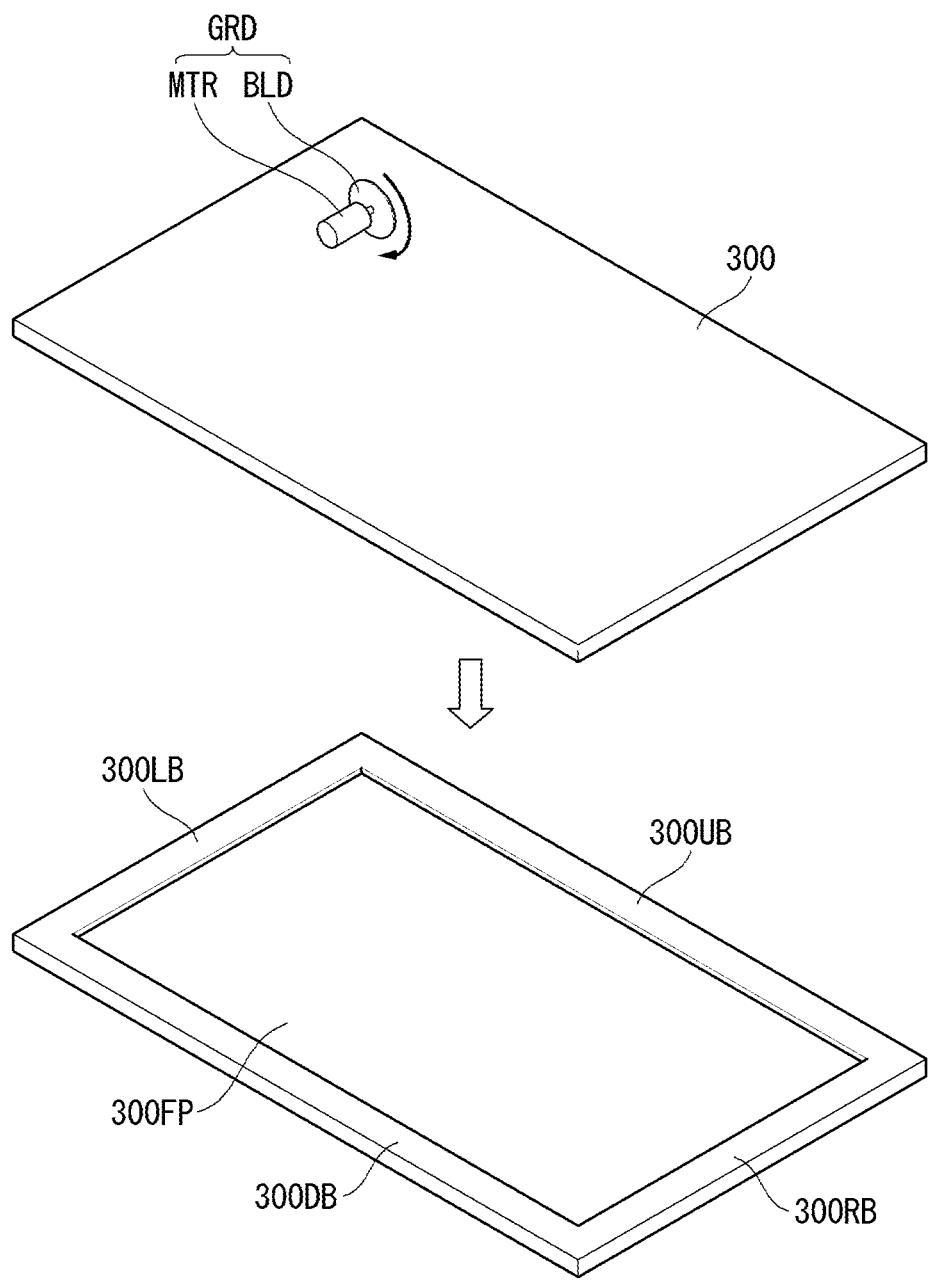

Referring to FIG. 27, the grinder GRD can process a flat plate-like rear plate 300. The grinder GRD can provide mechanical wear to the flat plate-like rear plate 300.

The grinder GRD may include a motor MTR and a blade BLD. The rigidity of the blade BLD may be greater than the rigidity of the rear plate 300. The blade BLD can rotate. The blade BLD may be connected to the motor MTR and may be provided with rotational force.

The blade BLD abuts on a surface of the rear plate 300 and is rotatable. The blade BLD may cut or grind the rear plate 300. The flat plate portion 300FP, the left bank 300LB, the right bank 300RB, the upper bank 300UB, and the lower bank 300DB can be formed by the grinder GRD.

Figure 28:
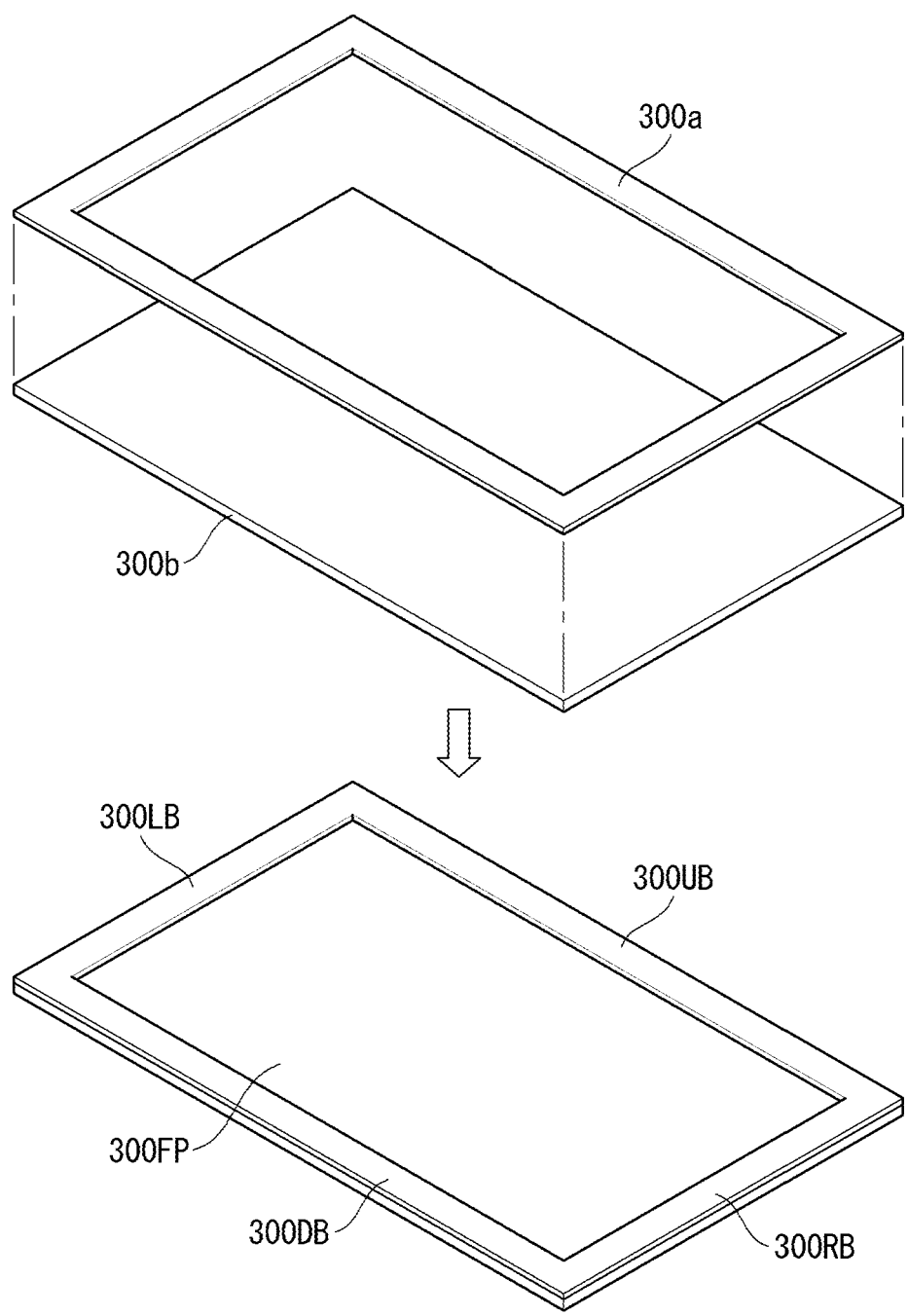

Referring to FIG. 28, the cover frame 300a may be attached to the front surface of the cover plate 300b. The cover plate 300b may have a flat plate shape. The cover plate 300b may be a flat plate portion 300FP of the rear plate 300. The cover frame 300a may have the shape of a photo frame.

The cover frame 300a and the cover plate 300b can form a boundary line. The cover frame 300a can form a bank of the rear plate 300. The banks of the rear plate 300 may include at least one of a left bank 300LB, a right bank 300RB, an upper bank 300UB, and a lower bank 300DB, for example.

Although not shown in the drawings, the cover frame 300a may have a rod shape. The cover frame 300a may include a plurality of bar frames.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel including:
     a front surface;
     a first edge positioned at an end of the front surface;
     a second edge positioned at another end of the front surface; and
   a rear plate positioned at a rear of the display panel, the rear plate including:
     a flat plate portion facing the display panel;
     a first wing bent and extended toward a front of the display panel from the flat plate portion, an end of the first wing protrudes above the front surface of the display panel to cover the first edge; and
     a second wing bent and extended toward the front of the display panel from the flat plate portion, an end of the second wing protrudes above the front surface of the display panel to cover the second edge,
   a middle plate placed between the display panel and the rear plate, wherein the middle plate is attached to the display panel, and
   a coupling protrusion projecting toward a rear of the middle plate from a rear surface of the middle plate, wherein the rear plate includes a fastening hole corresponding to the coupling protrusion, and wherein the coupling protrusion is fitted into the fastening hole of the rear plate, and
     wherein the coupling protrusion includes a hollow portion opened toward the rear of the middle plate,
   wherein the display device further comprises:
     a PCB plate positioned behind of the rear plate, the PCB plate including a fastening hole into which the coupling protrusion is fitted; and
     a screw configured to be fitted in the hollow portion formed in the coupling protrusion.

2. The display device of claim 1, wherein an air gap is formed between the middle plate and the rear plate.

3. The display device of claim 1, wherein the first edge is located opposite to the second edge, wherein the first wing is placed at a left side of the flat plate portion, and wherein the second wing is placed at a right side of the flat plate portion.

4. The display device of claim 1, further comprising:
   a member layer connected to the display panel, wherein at least a portion of the member layer is placed between the display panel and the rear plate;
   a source PCB connected to the member layer, the source PCB placed between the display panel and the rear plate; and
   a cable connected to the source PCB.

5. The display device of claim 2, wherein the middle plate includes a metal.

6. The display device of claim 3, wherein the display panel further includes a third edge connecting the first edge with the second edge, wherein the rear plate further includes a third wing, wherein the third wing is bent and extended toward the front of the display panel from the flat plate portion, and wherein the third wing covers the third edge.

7. The display device of claim 4, wherein the flat plate portion includes a slot, and wherein the cable passes through the slot.

8. The display device of claim 6, wherein the rear plate includes:
   a first corner adjacent to a location where an end of the first edge meets an end of the third edge; and
   a second corner adjacent to a location where an end of the second edge meets another end of the third edge,
   wherein an end of the first wing is adjacent to an end of the third wing and spaced apart from the end of the third wing at the first corner,
   wherein an end of the second wing is adjacent to another end of the third wing and spaced apart from the other end of the third wing at the second corner.

9. The display device of claim 7,
wherein the PCB plate coupled with the rear plate, the PCB plate including a cable hole corresponding to the slot; and
a T-con board mounted on a rear surface of the PCB plate,
wherein the cable passes through the slot of the rear plate and the cable hole of the PCB plate, and
wherein the cable is configured to be connected to the T-con board.

10. The display device of claim 8, wherein the display panel further includes a fourth edge connecting the first and second edges and facing the third edge, wherein the rear plate further includes a fourth wing, wherein the fourth wing is bent and extended toward the front of the display panel from the flat plate portion, and wherein the fourth wing covers the fourth edge.

11. The display device of claim 10, wherein the rear plate includes:
a third corner adjacent to a location where another end of the second edge meets an end of the fourth edge; and
a fourth corner adjacent to a location where another end of the first edge meets another end of the fourth edge,
wherein another end of the second wing is adjacent to an end of the fourth wing and spaced apart from the end of the fourth wing at the third corner,
wherein another end of the first wing is adjacent to another end of the fourth wing and spaced apart from the other end of the fourth wing at the fourth corner.

* * * * *